(12) United States Patent
Shim et al.

(10) Patent No.: US 12,176,360 B2
(45) Date of Patent: Dec. 24, 2024

(54) IMAGE SENSOR

(71) Applicant: SAMSUNG ELECTRONICS CO., LTD., Suwon-si (KR)

(72) Inventors: Eunsub Shim, Hwaseong-si (KR); Kyungho Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 538 days.

(21) Appl. No.: 17/501,584

(22) Filed: Oct. 14, 2021

(65) Prior Publication Data

US 2022/0285413 A1  Sep. 8, 2022

(30) Foreign Application Priority Data

Mar. 5, 2021 (KR) .................. 10-2021-0029431

(51) Int. Cl.
*H01L 27/146* (2006.01)

(52) U.S. Cl.
CPC .. *H01L 27/14612* (2013.01); *H01L 27/14643* (2013.01)

(58) Field of Classification Search
CPC ............. H01L 27/14612; H01L 27/14643
See application file for complete search history.

(56) References Cited

U.S. PATENT DOCUMENTS

| | | | |
|---|---|---|---|
| 7,427,736 B2 | 9/2008 | Xu et al. | |
| 9,832,407 B2 | 11/2017 | Hynecek | |
| 10,666,883 B2 | 5/2020 | Kim et al. | |
| 2009/0237540 A1* | 9/2009 | Johnson | ................ H04N 25/59 348/308 |
| 2009/0256156 A1* | 10/2009 | Hsieh | ................ H01L 27/14609 257/292 |
| 2010/0079643 A1 | 4/2010 | Andersson et al. | |
| 2018/0343405 A1* | 11/2018 | Nishikido | ............ H04N 25/589 |

FOREIGN PATENT DOCUMENTS

CN         108695350 A        10/2018

* cited by examiner

*Primary Examiner* — Thanh Luu
(74) *Attorney, Agent, or Firm* — Fish & Richardson P.C.

(57) ABSTRACT

An image sensor includes a pixel array including pixels, wherein each pixel includes at least one photodiode generating electrical charge and a pixel circuit providing a pixel signal based on the electrical charge. The images sensor also includes a logic circuit configured to generate an image based on the pixel signal, wherein the pixel circuit includes a parallel-connected first reset transistor and second reset transistor, and the logic circuit determines whether the second reset transistor is turned ON/OFF based on a level of incident light received by the at least one photodiode during an exposure time period.

19 Claims, 27 Drawing Sheets

IMAGE SENSOR

CROSS-REFERENCE TO RELATED APPLICATION

This application claims priority to Korean Patent Application No. 10-2021-0029431 filed on Mar. 5, 2021 in the Korean Intellectual Property Office, the subject matter of which is hereby incorporated by reference.

BACKGROUND

The inventive concept relates generally to image sensors.

Image sensors are semiconductor-based sensors receiving electromagnetic energy (e.g., visible light) and generating a corresponding electrical signal. Some image sensors include a pixel array including a plurality of unit pixels, as well as a logic circuit driving the pixel array. The unit pixels may include a photodiode that generates electrical charge in response to incident light received (e.g., reflected) from an external source, and a pixel circuit that converts the electrical charge generated by the photodiode into a corresponding electric signal.

Image sensors are widely used in many applications, such as smartphones, tablet Personal Computers (PCs), laptop computers, televisions, automobiles, etc. Various digital image processing circuits and devices, such as cameras capturing still images or videos may be used in these various applications. Recent research and development has proposed various methods directed to the improvement of noise characteristics and dynamic range of image sensors.

SUMMARY

Embodiments of the inventive concept provide image sensors including two reset transistors connected in parallel that exhibit improved overall performance and reduced noise characteristics (e.g., smear-like horizontal band noise or SHBN).

According to embodiments of the inventive concept, an image sensor may include; a pixel array including pixels, wherein each pixel includes at least one photodiode generating electrical charge and a pixel circuit providing a pixel signal based on the electrical charge, and a logic circuit configured to generate an image based on the pixel signal, wherein the pixel circuit includes a parallel-connected first reset transistor and second reset transistor, and the logic circuit determines whether the second reset transistor is turned ON/OFF based on a level of incident light received by the at least one photodiode during an exposure time period.

According to embodiments of the inventive concept, an image sensor may include; at least one photodiode that generates electrical charge based on a luminance level of incident light during an exposure time period, a floating diffusion that accumulates the electrical charge, at least one transfer transistor connected between the at least one photodiode and the floating diffusion, parallel-connected first reset transistor and second reset transistor connected between a power node providing a power supply voltage and the floating diffusion, and a drive transistor operating as a source-follower amplifier, wherein the first reset transistor and the second reset transistor have different threshold voltages.

According to embodiments of the inventive concept, an image sensor may include; at least one photodiode that generates electrical charge based on a luminance level of incident light during an exposure time period, and a pixel circuit including a floating diffusion that accumulates the electrical charge, at least one transfer transistor connected between the at least one photodiode and the floating diffusion, and parallel-connected first reset transistor and second reset transistor connected between a power node providing a power supply voltage and the floating diffusion, wherein the second reset transistor is different from the first reset transistor, and the second reset transistor is turned ON when the at least one transfer transistor is turned ON.

BRIEF DESCRIPTION OF DRAWINGS

The above and other aspects, features, and advantages of the inventive concept may be more clearly understood upon consideration of the following detailed description together with the accompanying drawings, in which.

DETAILED DESCRIPTION

Hereinafter, embodiments of the inventive concept will be described in some additional detail with reference to the accompanying drawings. Throughout the written description and drawings, like reference numbers and labels are used to denote like or similar elements, components, features and/or method steps.

Figure 1:
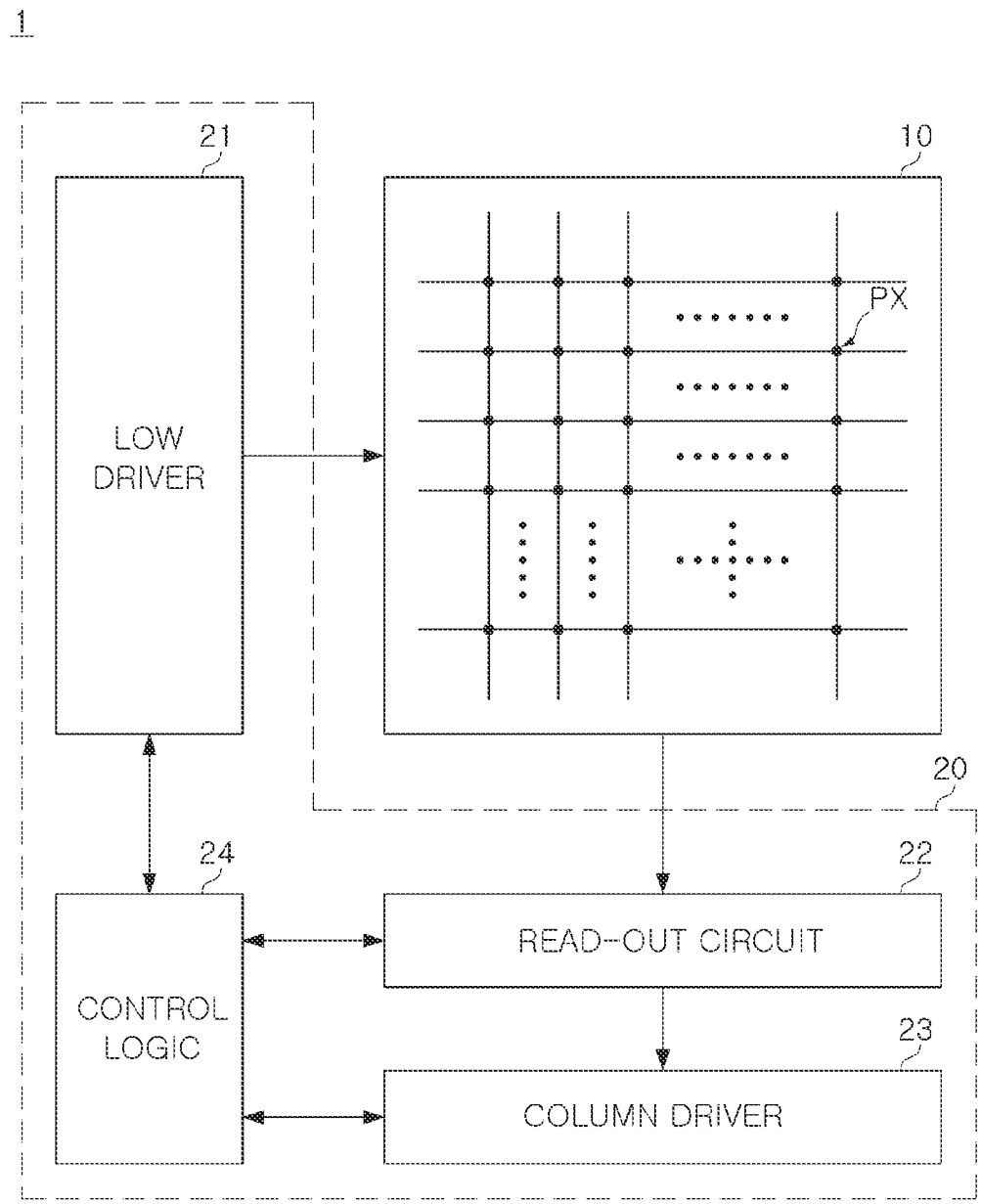
FIG. 1 is a block diagram illustrating an image sensor according to embodiments of the inventive concept.

FIG. 1 is a block diagram illustrating an image sensor according to an embodiment of the inventive concept.

Referring to FIG. 1, an image sensor 1 may generally include a pixel array 10 and a logic circuit 20.

The image sensor 1 may convert incident light (e.g., electromagnetic energy in one or more defined bands received in relation to an external source) into a corresponding electrical signal. This electrical signal may be used to generate an image signal or image data.

The pixel array 10 may include a plurality of unit pixels (or "pixels") PX arranged in a matrix (or array) including rows and columns Each of the pixels PX may include at least one photoelectric conversion element capable of generating electrical charge in response to incident light, and a pixel circuit capable of generating a pixel signal corresponding to the electrical charge.

In some embodiments, the photoelectric conversion element may be a photodiode (PD) including one or more semiconductor material(s). In some embodiments the PD may be an organic photodiode including one or more an organic materials. Here, each pixel PX may include two or more photoelectric conversion elements, wherein each of the two or more photoelectric conversion elements is configured to receive incident light (or particular wavelengths of the incident light) of different color in order to generate electrical charge.

In some embodiments, each pixel PX may include one or more photodiodes, wherein each photodiode is configured to effectively receive incident light at different luminance levels in order to generate electrical charge.

In some embodiment, each pixel PX may include a pixel circuit configured to generate a pixel signal from electrical charge generated by the at least one photoelectric conversion element (e.g., photodiode). For example, the pixel circuit may include a transfer transistor, a drive transistor, a select transistor, a reset transistor and a floating diffusion. The pixel circuit may be used to provide (or output) a reset voltage and a pixel voltage.

In this regard, the pixel voltage may correspond to the electrical charge generated by at least one photodiode included in each pixel PX and accumulated in a floating diffusion. For example, two or more adjacent pixels (e.g., two pixels physically adjacent to one another in the pixel array 10) may form a pixel group, wherein the two or more pixels of the pixel group share at least one of a transfer transistor, a drive transistor, a select transistor and a reset transistor.

In the image sensor 1 of FIG. 1, each pixel PX may include at least one photodiode including two (2) reset transistors. Further, a pixel circuit corresponding to each pixel PX may include some portion of two or more of a transfer transistor, a drive transistor and a select transistor. However, the scope of the inventive concept is not limited thereto.

The logic circuit 20 may be used to control the operation of the pixel array 10. For example, the logic circuit 20 may include a row driver 21, a read-out circuit 22, a column driver 23 and a control logic 24.

The row driver 21 may be used to actuate (or drive) pixels in the pixel array 10 according to a row unit. In this regard, the row driver 21 may be used to generate a transfer control signal controlling a transfer transistor of a pixel circuit, a reset control signal controlling a reset transistor, a selection control signal controlling a select transistor. These respective control signals may be variously applied to the pixel array 10 in a row unit.

The read-out circuit 22 may include a correlated double sampler (CDS) and an analog-to-digital converter (ADC). The CDS may perform a correlated double sampling operation by receiving a pixel signal from pixels PX connected to a selected row line (e.g., a row line selected by a row line selection signal generated by the row driver 21). The pixel signal may be received through respective column lines. The ADC may than convert the pixel signal detected by the CDS into a digital pixel signal provide the digital pixel signal to the column driver 23.

The image sensor 1 of FIG. 1 may adjust capacitance of a floating diffusion included in a pixel circuit. For example, the read-out circuit 22 may adjust a gain of the ADC based on the luminance level of incident light during an exposure time period, as incident light is applied to at least one photoelectric conversion element. Accordingly, when converting an output analog signal into a corresponding digital signal, the gain of the ADC will be suitably adjusted in relation to the luminance level of the incident light.

The column driver 23 may include a latch used to temporarily store a digital pixel signal, or a buffer circuit and an amplifying circuit that may process a digital pixel signal received from the read-out circuit 22. The row driver 21, the read-out circuit 22, and the column driver 23 may be controlled by the control logic 24. The control logic 24 may include a timing controller controlling the operational timing of the row driver 21, the read-out circuit 22 and the column driver 23. However, those skilled in the art will appreciate that the foregoing is merely an illustrative example, and other embodiments of the inventive concept may include other or additional components, and may be driven using a variety of approaches.

Figure 2:
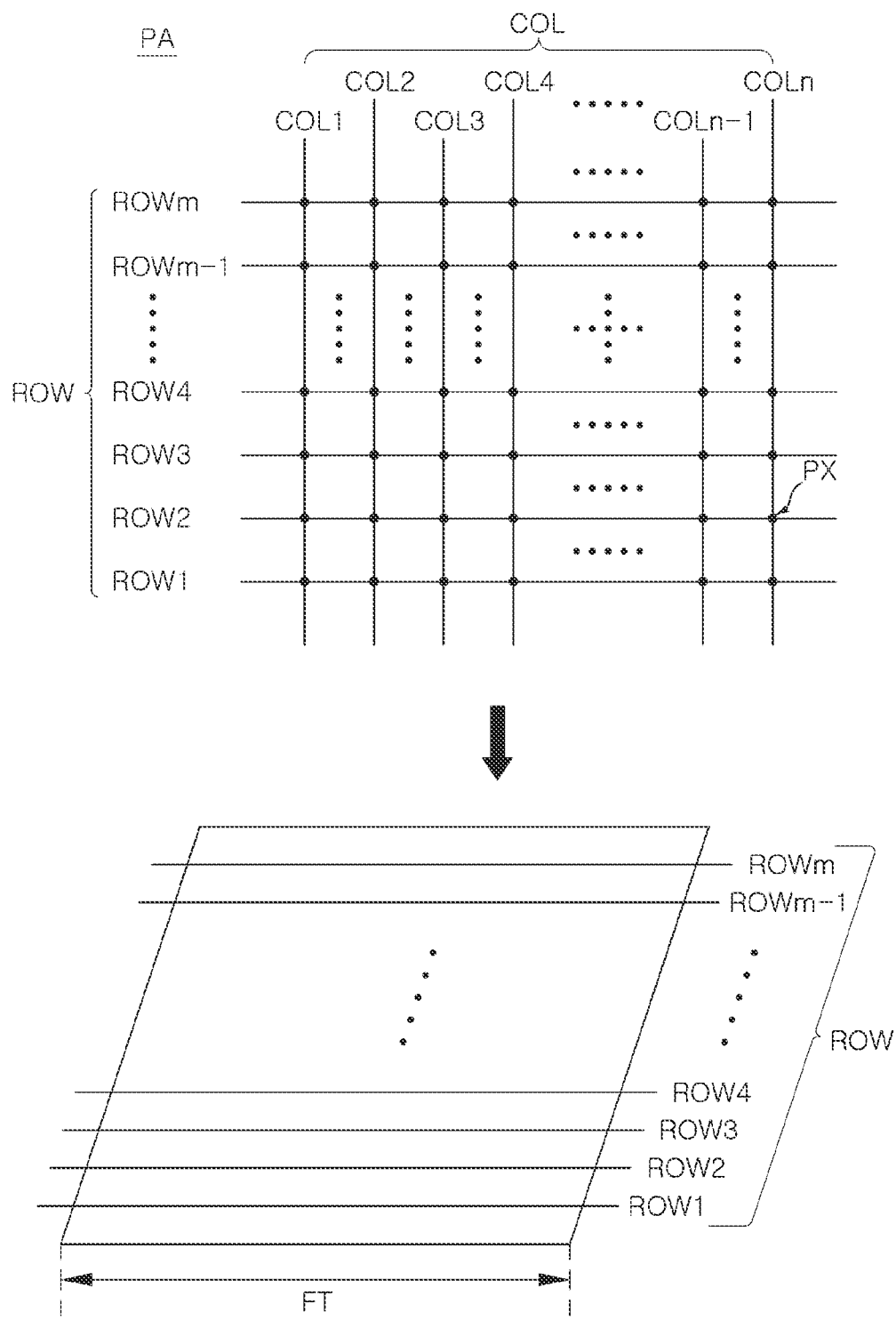
FIG. 2 is a conceptual diagram illustrating operation of an image sensor according to embodiments of the inventive concept.

FIG. 2 is a conceptual diagram illustrating operation of an image sensor according to embodiments of the inventive concept.

Referring to FIGS. 1 and 2, a pixel array PA of an image sensor according to an embodiment of the inventive concept may include pixels PX, wherein each pixel PX is connected to one of a plurality of row lines ROW (e.g., $ROW_1$ to $ROW_m$) and one of a plurality of column lines COL (e.g., $COL_1$ to $COL_n$). The image sensor may drive the pixels PX according to row units corresponding to the respective row lines ROW. For example, the image sensor may operate in a rolling shutter method that sequentially drives the row lines ROW.

Among the arrangement of pixels PX, pixels PX disposed at a same position in a horizontal direction may share a common column line. Pixels PX disposed at a same position in a vertical direction may be simultaneously selected by a row driver 21, and may therefore output a pixel signal through the respective column lines. In some embodiments, the read-out circuit 22 may simultaneously obtain a pixel signal from pixels PX selected by the row driver 21 through the respective column lines. Here, the pixel signal may include a reset voltage and a pixel voltage, wherein the pixel voltage corresponds to the electrical charge generated in response to incident light received by each pixel PX after application of the reset voltage.

A time period required to drive a selection driving line among the row lines and read a reset voltage and a pixel voltage from unit pixels PX connected to the selection driving line may be defined as one (1) horizontal period. Thus, a frame period FT for the image sensor 1 may be defined as a time period required to read a reset voltage and a pixel voltage from all pixels included in the pixel array PA. In some embodiments, the frame period FT may be greater than or equal to a product of a number of row lines ROW in the pixel array 10 and the horizontal period. As the frame period FT of the image sensor 1 is reduced, a greater number of image frames may be generated during a particular time period.

Figure 3:
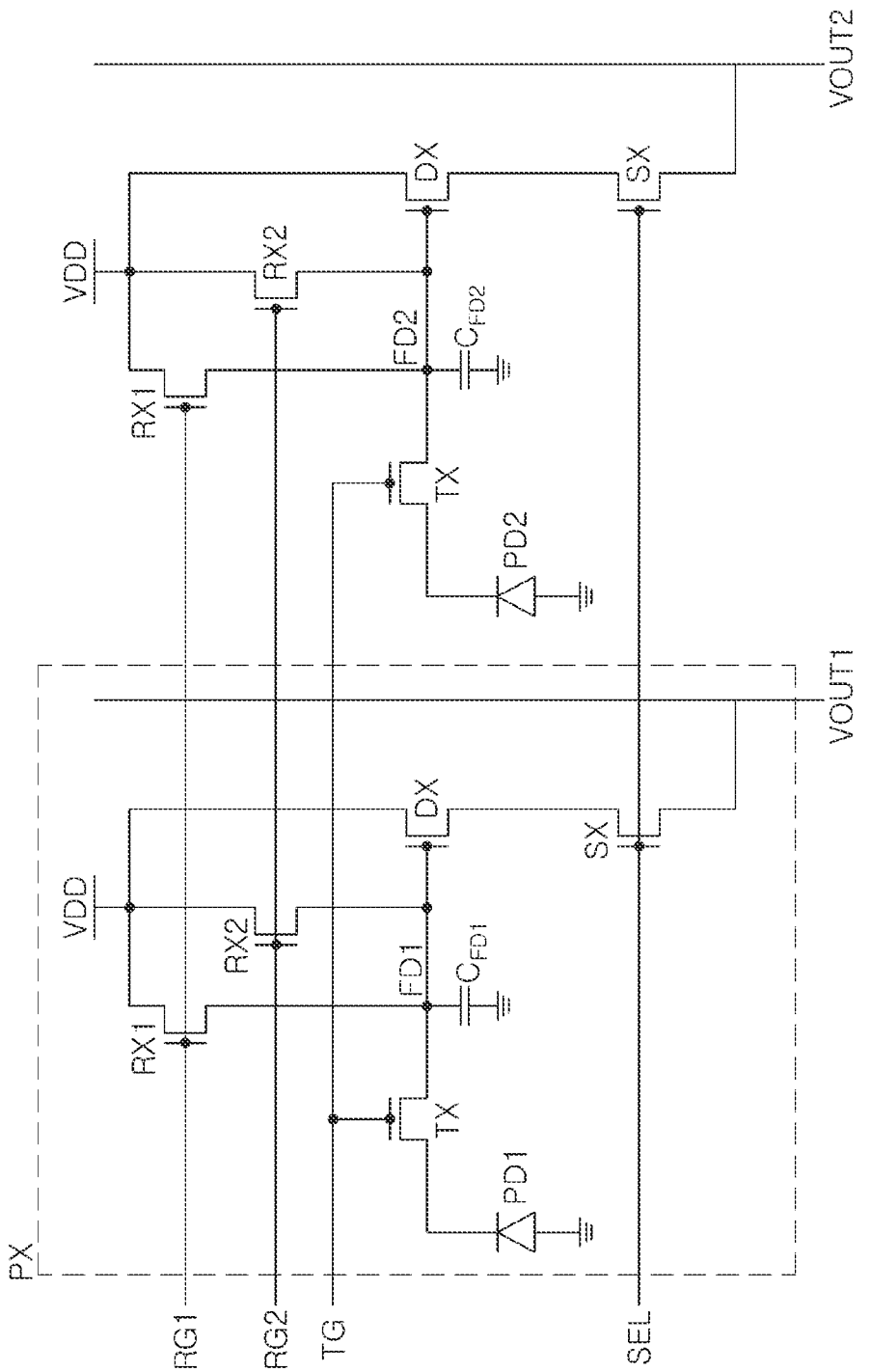
FIG. 3 is a circuit diagram illustrating a pixel that may be included in an image sensor according to embodiments of the inventive concept.

FIG. 3 is a circuit diagram illustrating a pixel PX that may be included in the image sensor 1 of FIG. 1.

Referring to FIG. 3, each pixel PX may include at least one of a first photodiode PD1 and a second photodiode PD2. These photodiode(s) may be used to generate electrical charge in response to incident light received during an exposure time period. A pixel circuit processing the electrical charge generated by the first photodiode PD1 and/or the second photodiode PD2 may generate a corresponding electrical signal. For example, the pixel circuit may include a floating diffusion FD, reset transistors RX1 and RX2, a drive transistor DX, a select transistor SX and a transfer transistor TX.

First and second reset transistors RX1 and RX2 may be respectively controlled by first and second reset control signals RG1 and RG2. For example, when the first and second reset transistors RX1 or RX2 are turned ON, a voltage of the floating diffusion FD may be reset by a power supply voltage VDD. After the voltage of the floating diffusion FD has been reset, the select transistor SX may be turned ON by a selection control signal SEL to output a reset voltage to at least one of column lines VOUT1 and VOUT2. In some embodiments, a process of providing (or outputting) reset voltage(s) to the first and second reset transistors RX1 and RX2 (e.g., selectively turning the reset transistors RX1 and RX2 ON and/or OFF—hereafter, "ON/OFF") may be varied.

Image sensors according to embodiments of the inventive concept may include "parallel-connected" two reset transistors RX1 and RX2. That is, the first reset transistor RX1 and the second reset transistor RX2 may be connected in parallel between a power node supplying a power supply voltage VDD and a floating diffusion FD. Electrodes of the first and second reset transistors RX1 and RX2 may be directly connected. Further in this regard, other elements such as a capacitor need not be connected between the first reset transistor RX1 and the second reset transistor RX2.

During a read-out operation of the pixel circuit, the first reset transistor RX1 and the second reset transistor RX2 may be turned ON/OFF at different times. For example, whether the second reset transistor RX2 is turned ON/OFF may be determined based on a luminance level (e.g., a degree of illuminance) of incident light received by the first photodiode PD1 and/or the second photodiode PD2.

In this regard, a logic circuit of an image sensor according to embodiments of the inventive concept may adjust gain in a process of converting a pixel signal output by the pixel circuit into a corresponding digital signal based on the luminance level of the incident light received by the first photodiode PD1 and/or the second photodiode PD2. Therefore, whether the second reset transistor RX2 is turned ON/OFF may be determined based on a gain applied to a pixel signal.

In an image sensor according to embodiments of the inventive concept, the turning ON/OFF of the first reset transistor RX1 and the second reset transistor RX2 may be controlled according to differing "heights" of respective potential barriers for the first reset transistor RX1 and the second reset transistor RX2. That is, the turning ON/OFF of the first reset transistor RX1 may vary (e.g., be different) in relation to the turning ON/OFF of the second reset transistor RX2.

Here, it should be noted that the first reset transistor RX1 and the second reset transistor RX2 play different roles in the operation of the pixel PX. Accordingly, a determination to turn ON/OFF the first reset transistors RX1 and/or the second reset transistor RX2 should be controlled independently. For example, the first reset transistor RX1 may be turned ON to reset the floating diffusion FD by the power supply voltage VDD, and the second reset transistor RX2 may be turned ON to drain electrical charge accumulated in the floating diffusion FD by the power supply voltage VDD before the read-out operation. That is, the second reset transistor RX2 may be used to remove unwanted electrical charge accumulated in the floating diffusion FD, thereby reducing noise signal problems, such as SHBN, that may adversely affect conventional image sensors.

The first photodiode PD1 and the second photodiode PD2 generate electrical charge (e.g., electrons and/or holes) in response to incident light. When the transfer transistor TX is turned ON after the reset voltage is output to the column line VOUT1 or VOUT2, electrical charge generated by the photodiode(s) PD may transfer (or move) to the floating diffusion FD1 or FD2. In this regard, the drive transistor DX may operate as a source-follower amplifier amplifying a voltage of the floating diffusion FD1 and FD2. When the select transistor SX is turned ON by the selection control signal SEL, the photodiode PD1 may be turned ON. A pixel voltage corresponding to electrical charge generated by the photodiode PD1 or PD2 may be output to the column line VOUT1 or VOUT2.

Each of the reset voltage and the pixel voltage may be detected by a sampling circuit connected to the column lines VOUT1 and VOUT2. The sampling circuit may include a plurality of samplers having a first input terminal and a second input terminal, wherein the sampler may receive a ramp voltage through the first input terminal. The sampler may compare the ramp voltage input through the first input terminal with a reset voltage and a pixel voltage input through the second input terminal. An ADC may be connected to an output terminal of the sampler, and the ADC may output reset data corresponding to results of comparing the ramp voltage and the reset voltage, and pixel data corresponding to results of comparing the ramp voltage and the pixel voltage. Control logic may generate image data using a pixel signal corresponding to a difference between the reset data and the pixel data.

FIGS. 4, 5A, 5B, 6A and 6B are conceptual diagrams illustrating a comparative image sensor and operation of the comparative image sensor.

Figure 4:
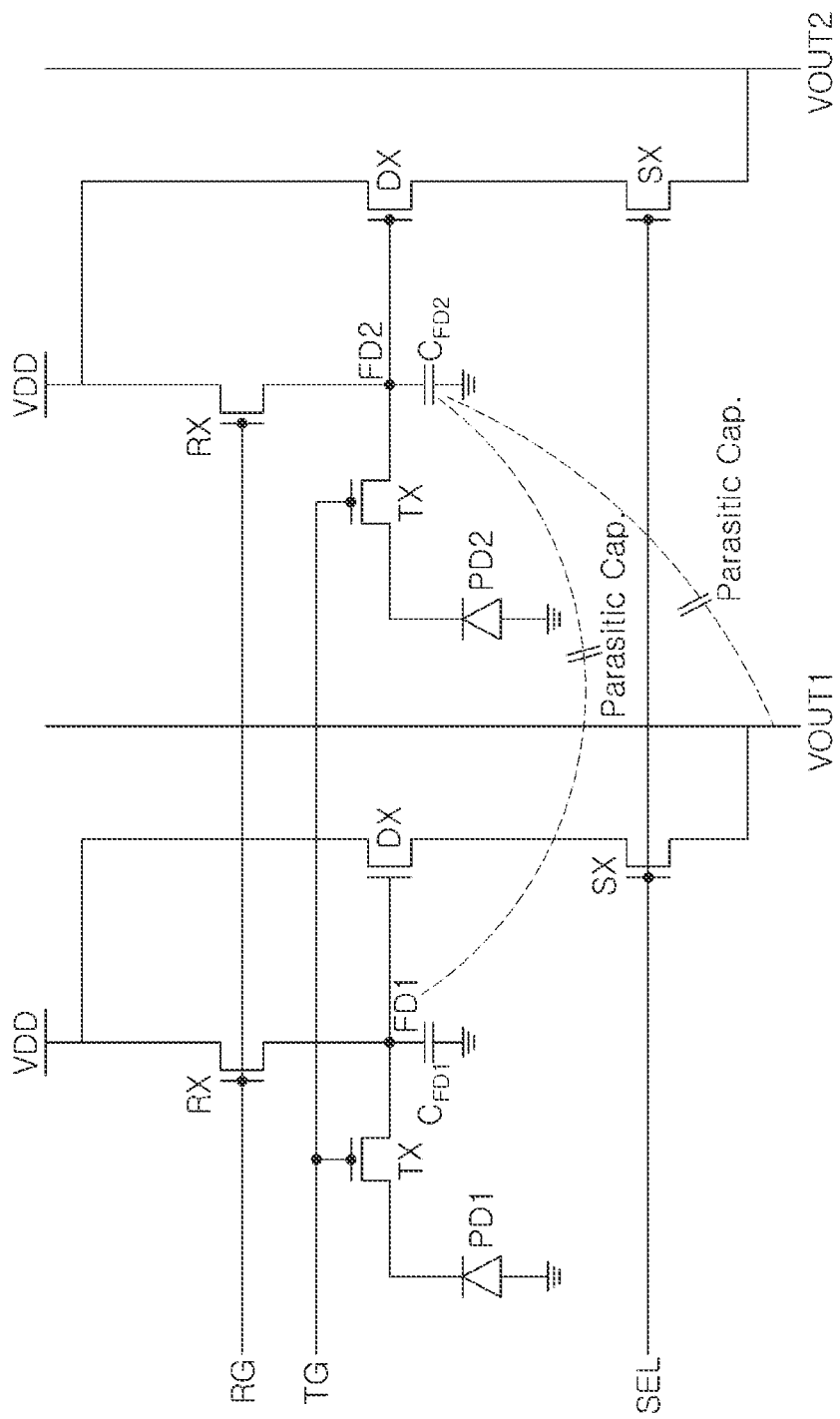
FIG. 4 is a circuit diagram illustrating a comparative image sensor.

Referring to FIG. 4, a pixel circuit illustrating the comparative image sensor including a reset transistor RX connected between a power node supplying a power supply voltage VDD and a floating diffusion FD.

When the reset transistor RX is turned ON, a voltage of the floating diffusion FD may be reset by the power supply voltage VDD. Once the voltage of the floating diffusion FD is reset, a select transistor SX may be turned ON by a selection control signal SEL to output a reset voltage to column line VOUT1 or VOUT2. Other read-out operations may be similar to the read-out operation of an image sensor described in relation to the embodiment of FIG. 3.

FIGS. 5A and 5B, and FIGS. 6A and 6B are conceptual diagram illustrating read-out operation for the comparative image sensor when the first photodiode PD1 and the second photodiode PD2 of FIG. 4 (i.e., photodiodes included in adjacent pixels) receive (e.g., are exposed to) different luminance levels of incident light. Here, it is assumed that the first photodiode PD1 receives a first luminance level that is higher than a second luminance level received by the second photodiode PD2. Hence, the first photodiode PD1 will generate greater electrical charge consistent with a relatively brighter environment during a read-out operation, while the second photodiode PD2 will generate lesser electrical charge consistent with a relatively darker environment during the read-out operation.

Figure 5A:
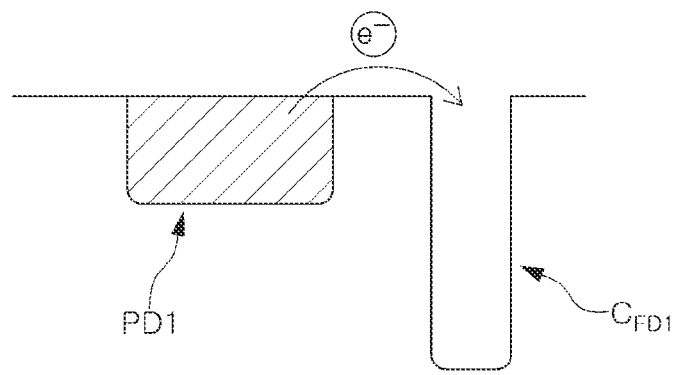
FIGS. 5A, 5B, 6A and 6B are related conceptual diagrams illustrating operation of the comparative image sensor of FIG. 4.
Figure 5B:
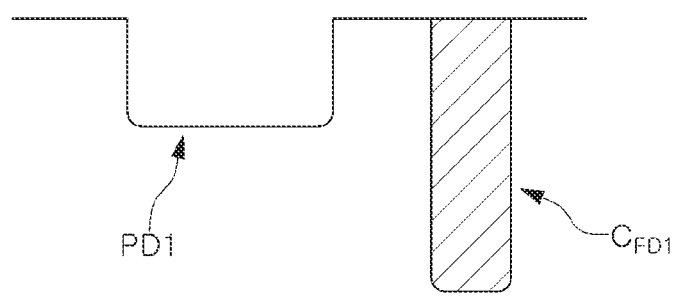

Continuing this working assumption and referring to FIGS. 5A and 5B, the relatively greater electrical charge generated by the first photodiode PD1 may transfer to a first floating diffusion FD1 when a transfer transistor TX is turned ON. That is, the transferred electrical charge accumulates in a first floating capacitor $C_{FD1}$ connected to the first floating diffusion FD1.

Figure 6A:
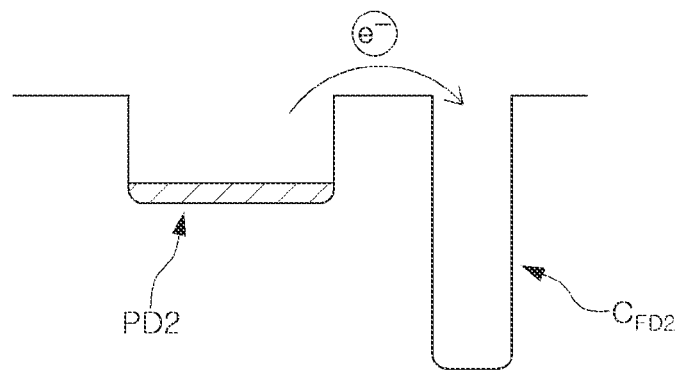
Figure 6B:
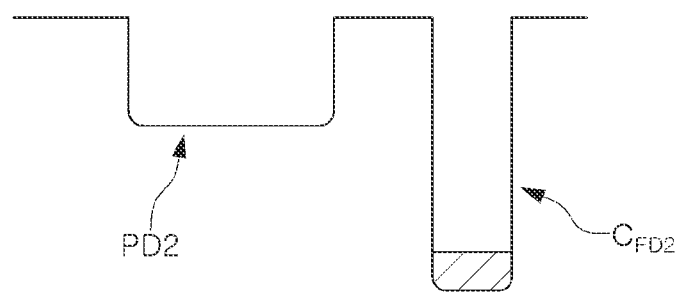

Referring now to FIGS. 6A and 6B, the lesser electrical charge generated by the second photodiode PD2 may transfer to a second floating diffusion FD2 when a transfer transistor TX is turned ON. That is, the transferred electrical charge accumulates in a second floating capacitor $C_{FD2}$ connected to the second floating diffusion FD2.

Thus, a first amount of electrical charge accumulated in the first floating capacitor $C_{FD1}$ is much greater than a second amount of electrical charge accumulated in the second floating capacitor $C_{FD2}$.

Extending the working assumption and referring to FIGS. 4, 5A, 5B, 6A and 6B, a parasitic capacitance may form due to the difference between the first amount of accumulated electrical charge and the second amount of accumulated electrical charge and in relation to conductive (e.g., metal) lines connecting the first floating capacitor $C_{FD1}$ and the second floating capacitor $C_{FD2}$ and/or conductive lines associated with the column lines VOUT1 and VOUT2 used to output pixel signals corresponding to the accumulated electrical charge. This parasitic capacitance may induce noise signal(s) (e.g., a smear-like horizontal band noise, SHBN). Such noise signal(s) may be particularly adverse in their effect in relation to the second (relatively low level) pixel signal output by the pixel including the second photodiode PD2 which senses the relatively darker environment.

Figure 7:
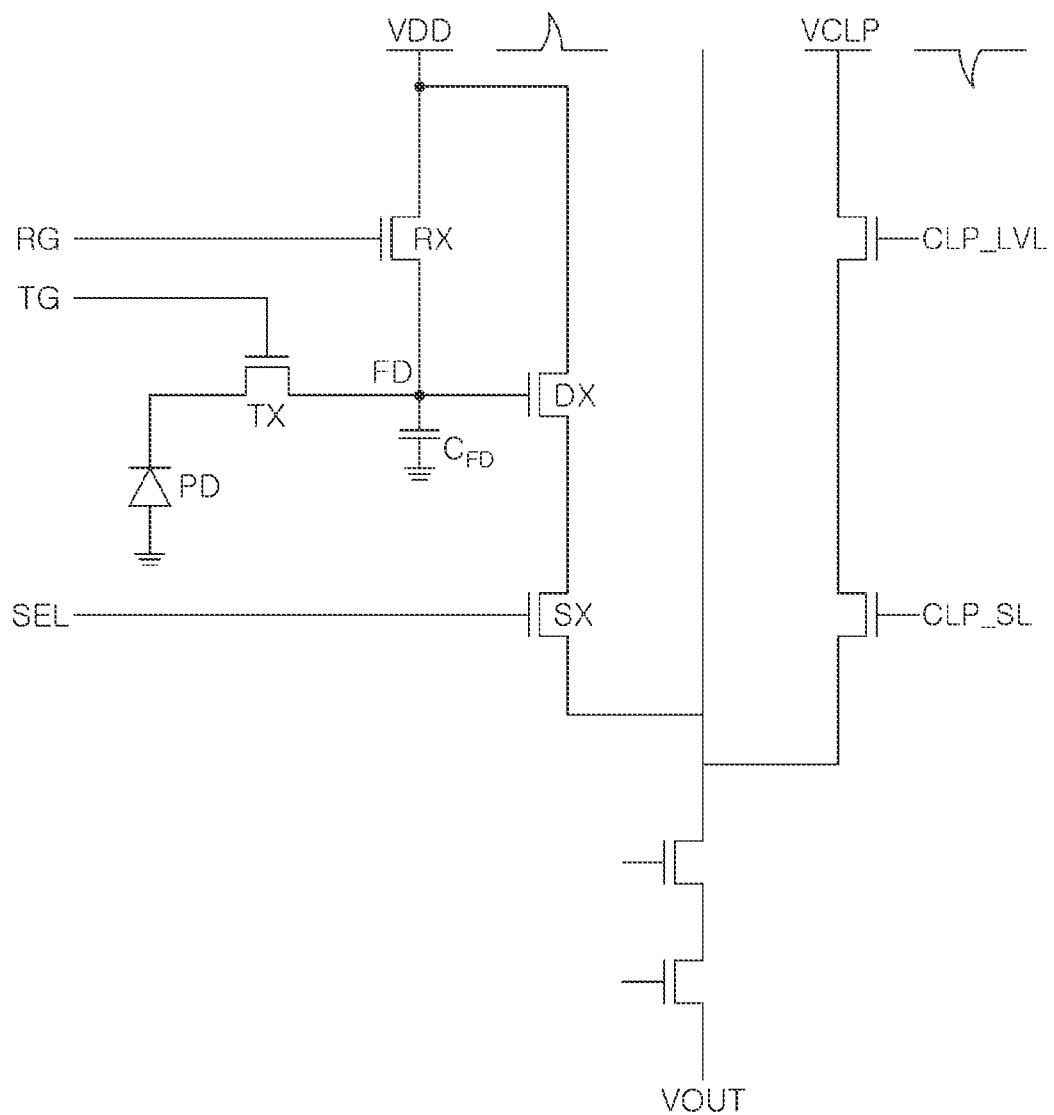
FIG. 7 is a circuit diagram illustrating a comparative image sensor including a clamping circuit.
Figure 8:
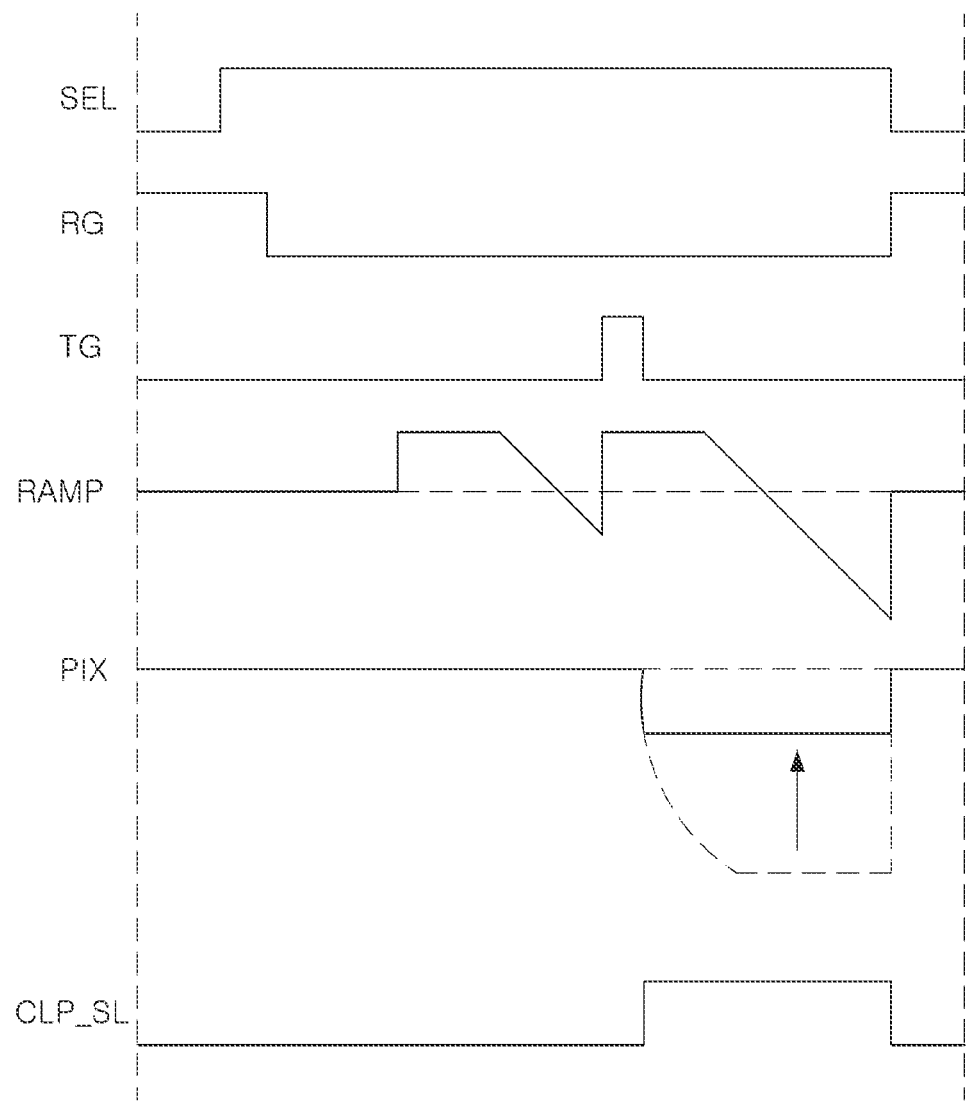
FIG. 8 is a signal diagram illustrating operation of the comparative image sensor of FIG. 7.

FIG. 7 is a circuit diagram illustrating a pixel circuit of a comparative image sensor including a clamping circuit, and FIG. 8 is a signal diagram illustrating operation of the pixel circuit of FIG. 7.

The pixel circuit of FIG. 7 is analogous to the pixel circuit of FIG. 4, but further includes a clamping circuit. Here, the clamping circuit may include at least one clamping transistor CLP_LVL and CLP_SL connected between an output node VOUT and a clamping power node to which a clamping power supply voltage VCLP is applied. The at least one clamping transistor CLP_LVL and CLP_SL may be a transistor defining (or setting) a degree of correcting for reset signal, and may apply a clamping signal to the output node VOUT.

In some embodiments, the clamping power supply voltage VCLP may be an externally provided voltage (e.g., power supply voltage VDD) or similar voltage.

The signal diagram of FIG. 8 illustrates a read-out operation performed by the pixel circuit of FIG. 7. Here, before a read-out operation is performed by the comparative pixel circuit of a comparative image sensor, when a reset transistor RX is turned ON by a reset control signal RG, a voltage of a floating diffusion FD may be reset. Once the voltage of the floating diffusion FD is reset, the reset transistor RX may be turned OFF, and a reset voltage may be read-out by an activated selection control signal SEL. When the read-out of the reset voltage is complete, a transfer transistor TX may be turned ON by a transfer control signal TG, and electrical charge generated by a photodiode PD may transfer to the floating diffusion FD. Thereafter, read-out of a pixel voltage may be performed based on electrical charge accumulated in a floating capacitor $C_{FD}$.

During the read-out operation of a pixel signal, the clamping circuit may correct a pixel signal in relation to the output node VOUT using a drive transistor DX and a select transistor SX. For example, during a read-out operation of a pixel signal, a pixel voltage PIX may be maintained as the reset voltage until the transfer control signal TG is activated. When the transfer control signal TG is activated and the transfer transistor TX is turned ON, electrical charge accumulated in the photodiode PD may transfer to the floating diffusion FD. Therefore, the pixel voltage PIX may decrease as shown in FIG. 8. When this happens, the clamping circuit may correct (or adjust) the level of the pixel signal to limit its decreasing level.

However, again referring to FIG. 7, when the clamping circuit is added to the comparative pixel circuit of FIG. 4, disturbance of a power source may occur during the clamping operation. And when these conditions are present, noise signal(s) (e.g., a SHBN) may be generated during a clamping operation. That is, a problem may arise in that the clamping power supply voltage VCLP rapidly decreases and current flowing to the clamping transistors CLP_LVL and CLP_SL increases due to a clamping circuit correcting the pixel signal. Alternately or additionally, a problem may arise in that the power supply voltage VDD rapidly increases and current flowing to the drive transistor DX and the select transistor SX decreases. These problematic effects, potentially among others, arising from disturbance of a power source may generate noise adversely affecting the integrity of the pixel signal.

Figure 9:
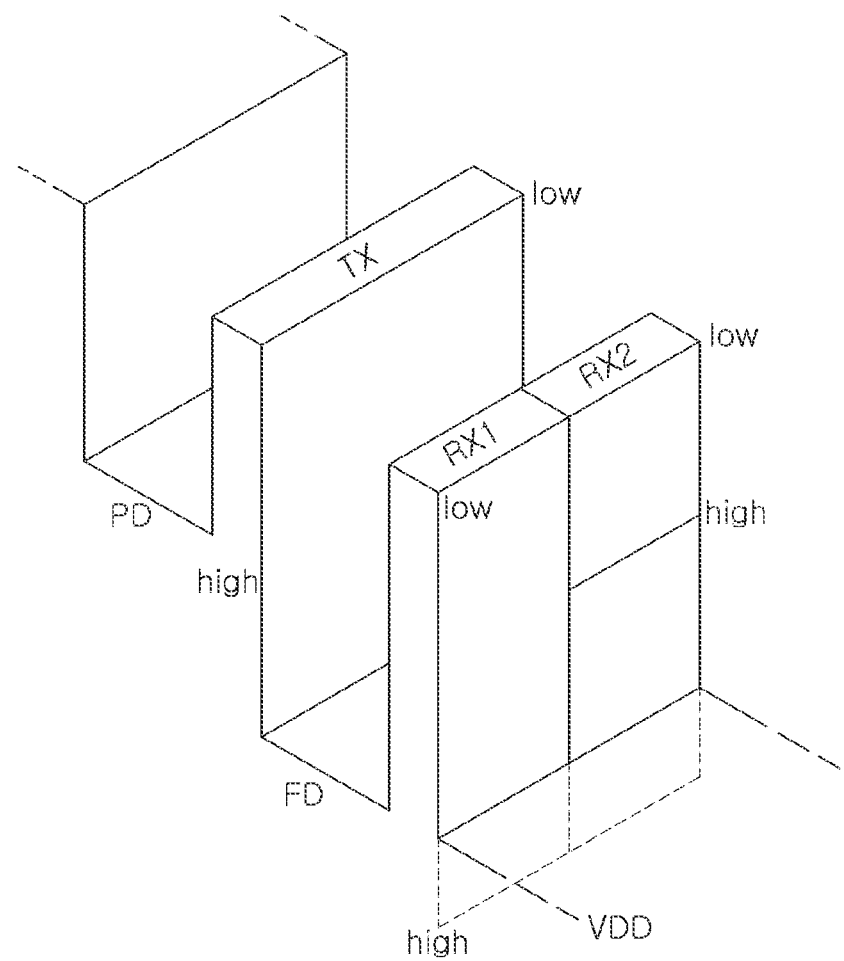
FIG. 9 is a conceptual diagram illustrating two reset transistors included in an image sensor according to embodiments of the inventive concept.

FIG. 9 is a conceptual diagram illustrating two (2) reset transistors that may be included in an image sensor according to embodiments of the inventive concept.

Referring to FIG. 9, the performing of a read-out operation by a pixel circuit of an image sensor according to embodiments of the inventive concept may be understood in relation to multiple potential wells separated by intervening potential barriers. For example, a photodiode PD, a floating diffusion FD, and a power node to which a power supply voltage VDD is applied may constitute respective potential wells, and a transfer transistor TX, a first reset transistor RX1, and a second reset transistor RX2 may constitute respective potential barriers separating the potential wells.

Assuming an image sensor according to embodiments of the inventive concept including parallel-connected first reset transistor RX1 and second reset transistor RX2, the potential wells and potential barriers illustrated in FIG. 9 may be considered—bearing in mind that the arrangement, shapes, magnitudes and separation relationships of the potential wells and potential barriers are merely illustrative and may vary with specific embodiment.

Here, a height of a potential barrier may vary depending on whether the transfer transistor TX, the first reset transistor RX1, and the second reset transistor RX2, corresponding to the potential barriers are respectively turned ON/OFF. Further, when one or more of these transistors is turned ON/OFF, the corresponding height of the potential barrier may be different for each of the transistors. For example, referring to FIG. 9, a height of a potential barrier corresponding to the turn-ON voltage may be relatively "high" while a height of the potential barrier corresponding to the turn-OFF voltage may be relatively "low."

In some embodiments, the first reset transistor RX1 and the second reset transistor RX2 perform different roles as previously described. Thus, a height of a potential barrier when the first reset transistor RX1 is turned ON/OFF may be different from a height of a potential barrier when the second reset transistor RX2 is turned ON/OFF. For example, respective turn-ON voltages and turned-OFF voltages of the first reset transistor RX1 and the second reset transistor RX2 may be different.

Hence, a second turn-ON voltage corresponding to a height of a potential barrier when the second reset transistor RX2 is turned ON may be less than (e.g., lower than) a first turned-ON voltage corresponding to a height of a potential barrier when the first reset transistor RX1 is turned ON. For example, the first turn-ON voltage may be between 2V and 4V, and the second turn-ON voltage may be less than the first turn-ON voltage.

A second turn-OFF voltage corresponding to a height of a potential barrier when the second reset transistor RX2 is turned OFF may be less than or equal to a first turn-OFF voltage corresponding to a height of a potential barrier when the first reset transistor RX1 is turned OFF. For example, the first turn-OFF voltage may be about 0V and the second turn-OFF voltage may be less than or equal to the first turn-OFF voltage.

In some embodiments, a determination of the respective (and potentially different) turn-ON voltages and turn-OFF voltages for the first reset transistor RX1 and the second reset transistor RX2 may include applied various voltages to the transistors and/or defining various threshold voltages for the transistors.

Referring to FIG. 3, a first reset control signal RG1 may be applied to a first gate electrode of the first reset transistor RX1, and a second reset control signal RG2 may be applied to a second gate electrode of the second reset transistor RX2. For example, during the read-out operation performed by the image sensor, the first reset transistor RX1 may be turned OFF, and the second reset transistor RX2 may be turned ON/OFF.

In some embodiments, the turn-ON voltages and turn-OFF voltages of transistors may be designed differently by adjusting the first reset control signal RG1 and the second reset control signal RG2. For example, when the first reset transistor RX1 and the second reset transistor RX2 are turned OFF, the second reset control signal RG2 may have a level less than the level of the first reset control signal RG1. When the first reset transistor RX1 is turned OFF and the second reset transistor RX2 is turned ON, the second reset control signal RG2 has a higher level than the first reset control signal RG1.

In this regard, turn-ON voltages and turn-OFF voltages of transistors may be set differently by adjusting threshold voltages of the first reset transistor RX1 and the second reset transistor RX2. For example, the first reset transistor RX1 and the second reset transistor RX2 may be adjusted to have different threshold voltages. For example, a second threshold voltage of the second reset transistor RX2 may be adjusted to have a level greater than a first threshold voltage of the first reset transistor RX1.

In contrast to the embodiment illustrated in FIG. 3, when turn-ON voltages and turn-OFF voltages of transistors are designed differently by adjusting the first threshold voltage and the second threshold voltage, the first gate electrode of the first reset transistor RX1 may be connected to the second gate electrode of the second reset transistor RX2. For example, the first reset control signal RG1 and the second reset control signal RG2 may be respectively applied to the first gate electrode and the second gate electrode through the same metal line.

When gain associated with a pixel signal is relatively low, noise signal(s) due to parasitic capacitance will be a critical problem. However, when gain associated with the pixel signal is relatively high, noise signals will be amplified, thereby potentially causing performance problems for the image sensor.

In view of the foregoing, image sensors according to embodiments of the inventive concept successfully address these problem using parallel-connected first reset transistor RX1 and the second reset transistor RX2. With this configuration, the second reset transistor RX2 may be used to selectively drain electrical charge accumulated in the floating diffusion FD to the power node in a high gain mode, thereby reducing parasitic capacitance and reducing the possibility of noise such as SHBN. Thus, image sensors according to embodiments of the inventive concept may use a method of directly draining electrical charge excessively accumulated in a predetermined range from each pixel to a power node before a read-out operation is performed for a pixel signal. Therefore, problems relating to disturbance of power source occurring in the operation of the clamping circuit, as described in relation to the comparative image sensor of FIG. 7, will not occur.

FIGS. 10A, 10B, 10C, 11A, 11B and 11C (hereafter collectively, "FIGS. 10A to 11C") are conceptual diagrams illustrating operation of an image sensor according to embodiments of the inventive concept.

Figure 10A:
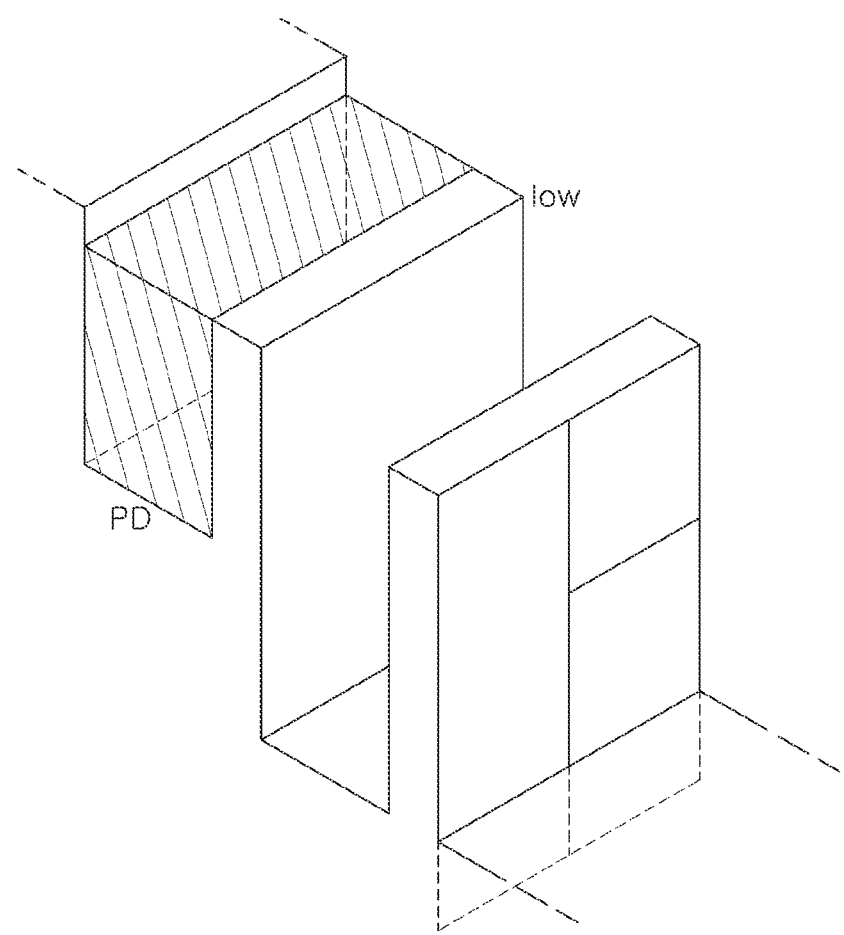
FIGS. 10A, 10B, 10C, 11A, 11B and 11C are conceptual diagrams illustrating operation of an image sensor according to embodiments of the inventive concept.
Figure 10B:
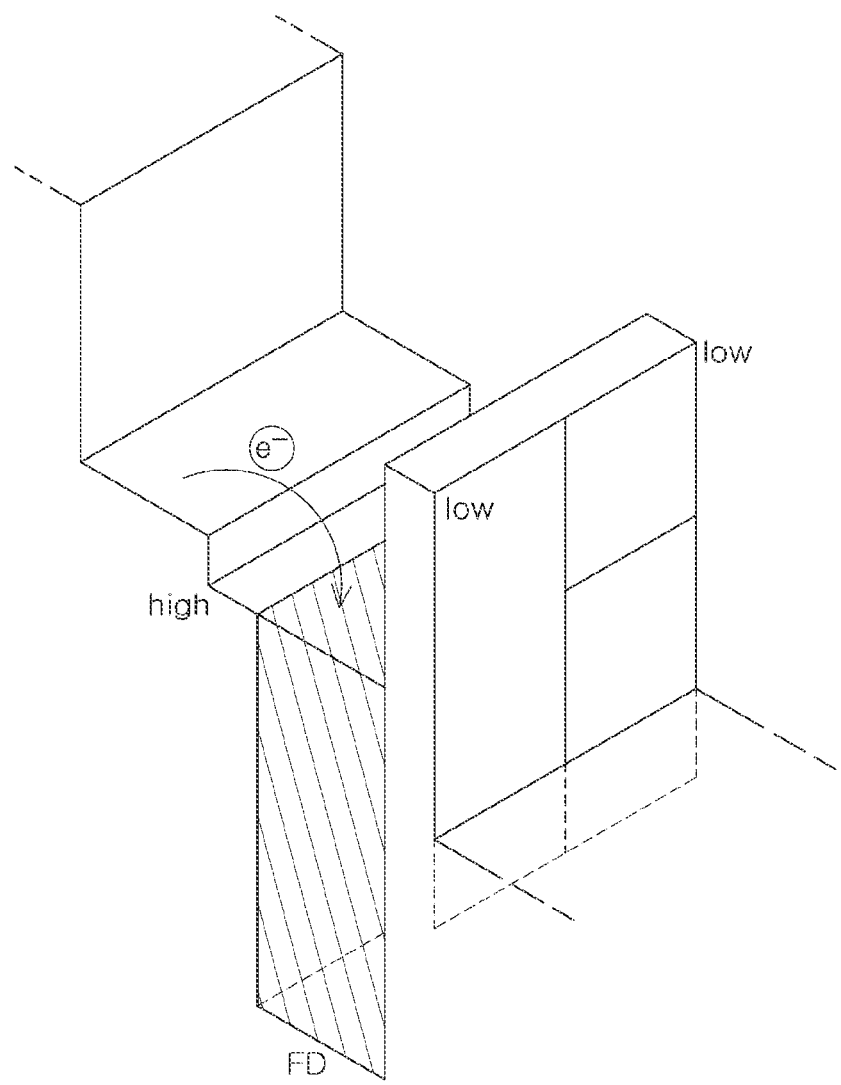
Figure 10C:
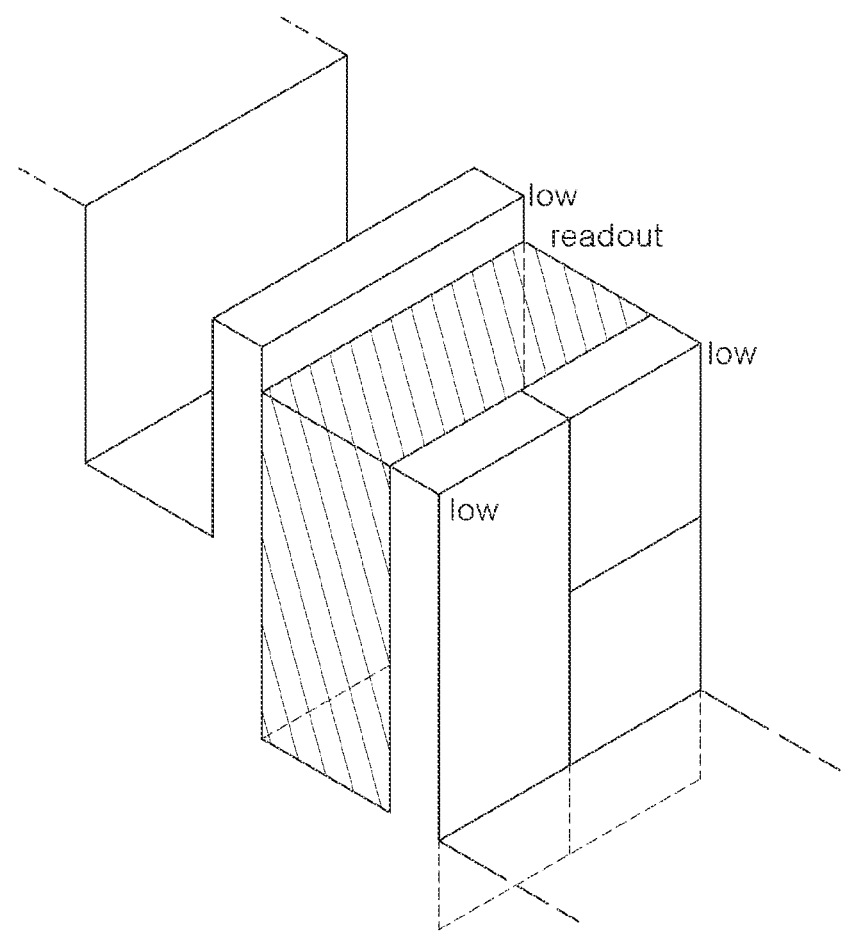
Figure 11A:
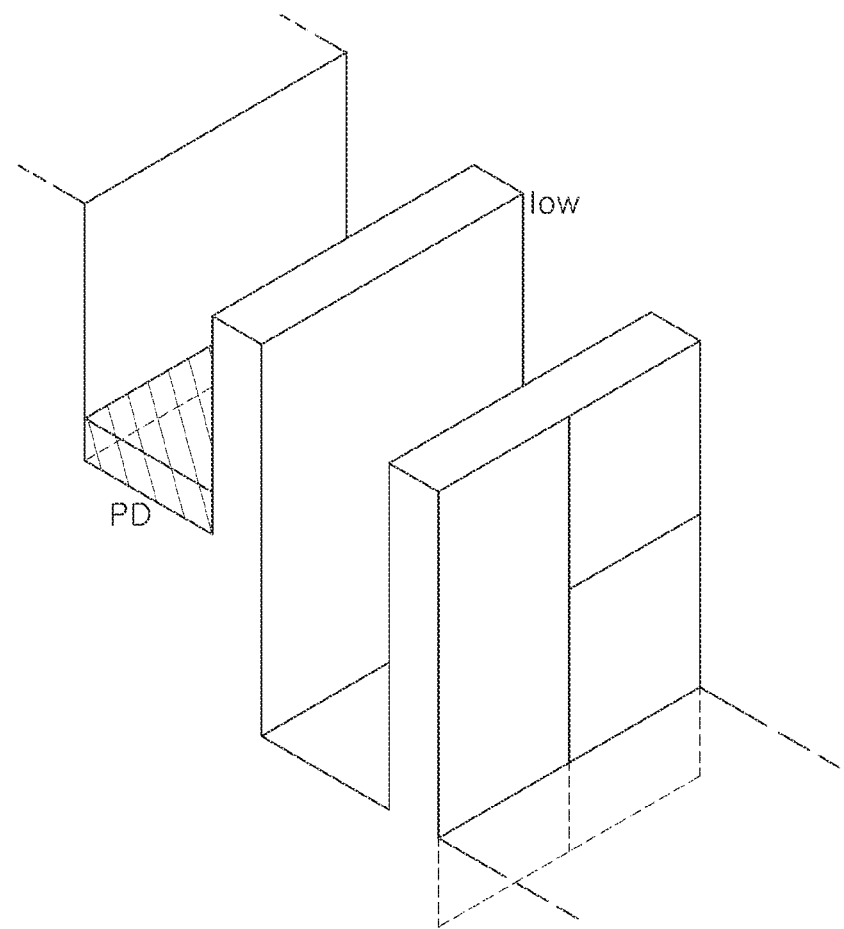
Figure 11B:
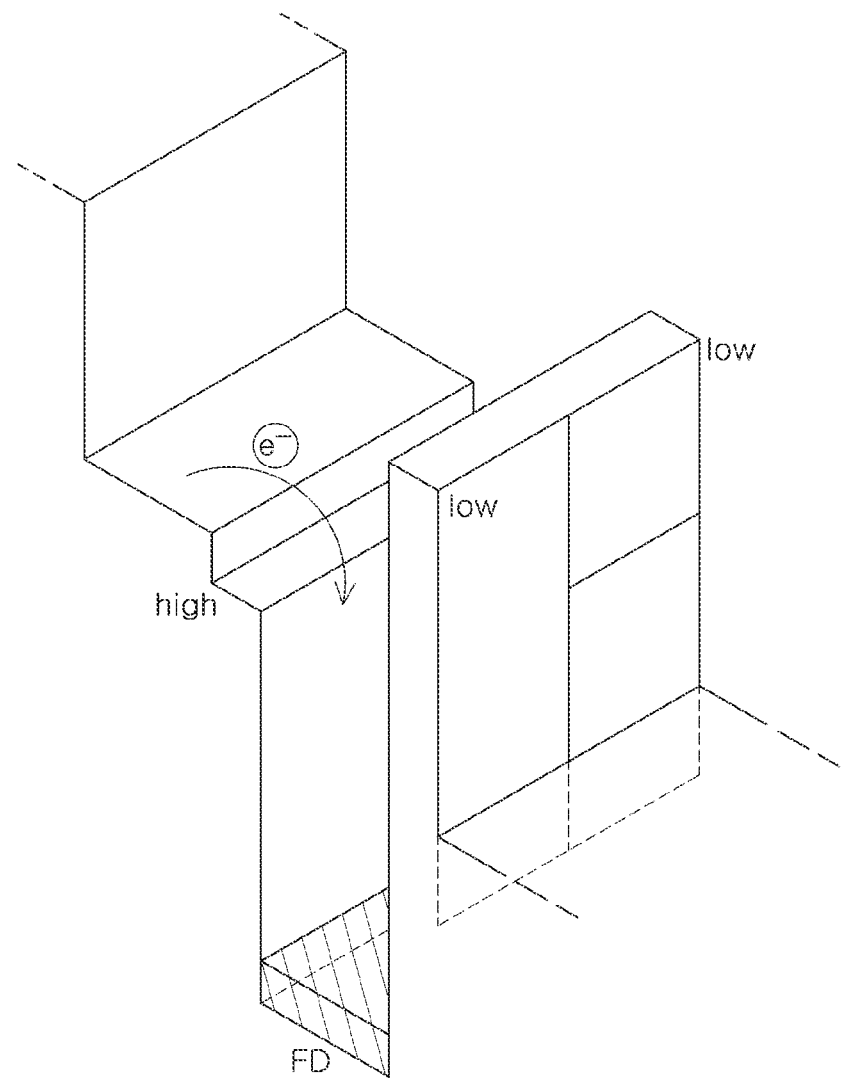
Figure 11C:
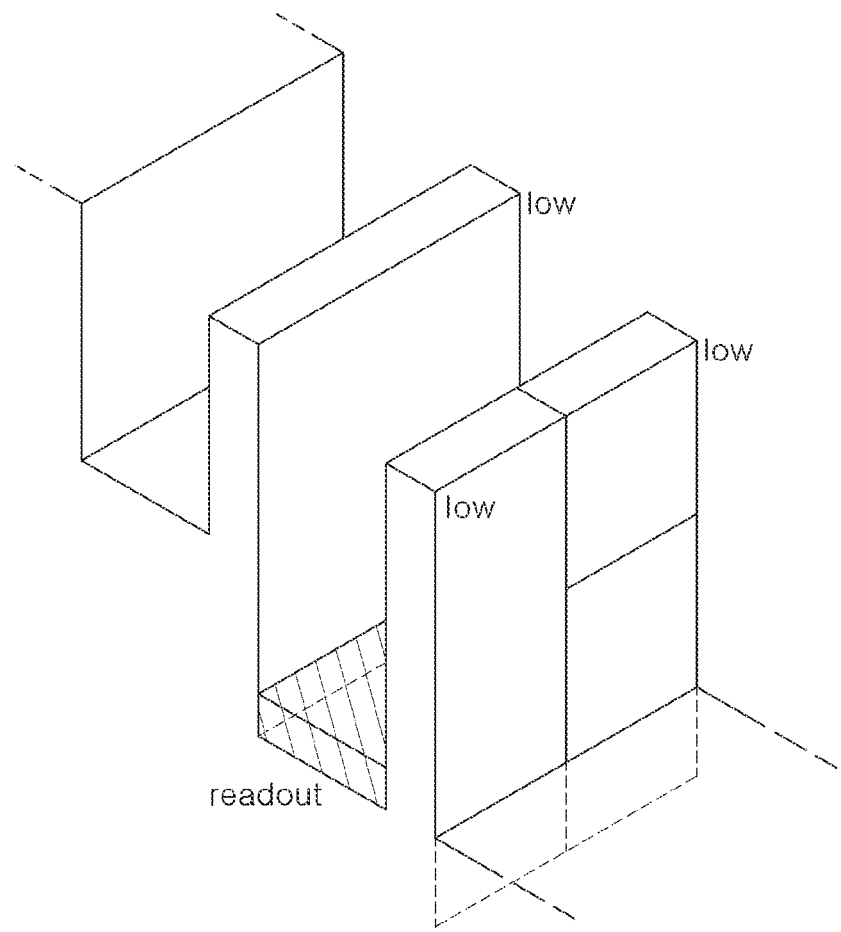

Here, FIGS. 10A, 10B and 10C illustrate a read-out operation when at least one photodiode PD included in a pixel receives incident light having a high luminance level while operating in a relatively low gain mode. FIGS. 11A, 11B and 11C illustrate a read-out operation when at least one photodiode PD included in another pixel receives incident light a low luminance level while operating in a relatively low gain mode.

Referring to FIG. 10A, at least one photodiode PD may generate electrical charge corresponding to a relatively brighter environment (high luminance level). The generated electrical charge is accumulated in the photodiode PD that has a low potential barrier when a transfer transistor TX is turned OFF.

Referring to FIGS. 10B and 10C, when a transfer transistor TX has a high potential barrier when the transfer transistor TX is turned ON, the accumulated electrical charge transfers to a floating diffusion FD (e.g., a floating capacitor connected to the floating diffusion FD). When performing a read-out operation in a low gain mode, a first reset transistor RX1 and a second reset transistor RX2 may be turned OFF. Therefore, the first reset transistor RX1 and the second reset transistor RX2 may have a low potential barrier with a relatively higher height.

Referring to FIGS. 11A, 11B and 11C, at least one photodiode PD included in another unit pixel may generate electrical charge in a relatively dark environment (low luminance level). Operation of transistors and transfer of electrical charge may be generally similar to that described with reference to FIGS. 10A, 10B and 10C. However, an amount of electrical charge generated by the at least one photodiode PD of FIGS. 11A, 11B and 11C will be less than an amount of electrical charge generated by the at least one photodiode PD of FIGS. 10A, 10B and 10C.

Comparing FIGS. 10C and 11C, during a read-out operation, the first reset transistor RX1 and the second reset transistor RX2 may have a relatively high potential barrier. Therefore, the image sensor may perform the read-out operation based on all of the electrical charge accumulated in the floating diffusion FD. Parasitic capacitance may be formed by coupling between floating diffusions FDs having significantly different amounts of accumulated electrical charge. As described above, when gain for a pixel signal is relatively small, noise signal(s) due to the parasitic capacitance are not a critical problem.

Figure 12:
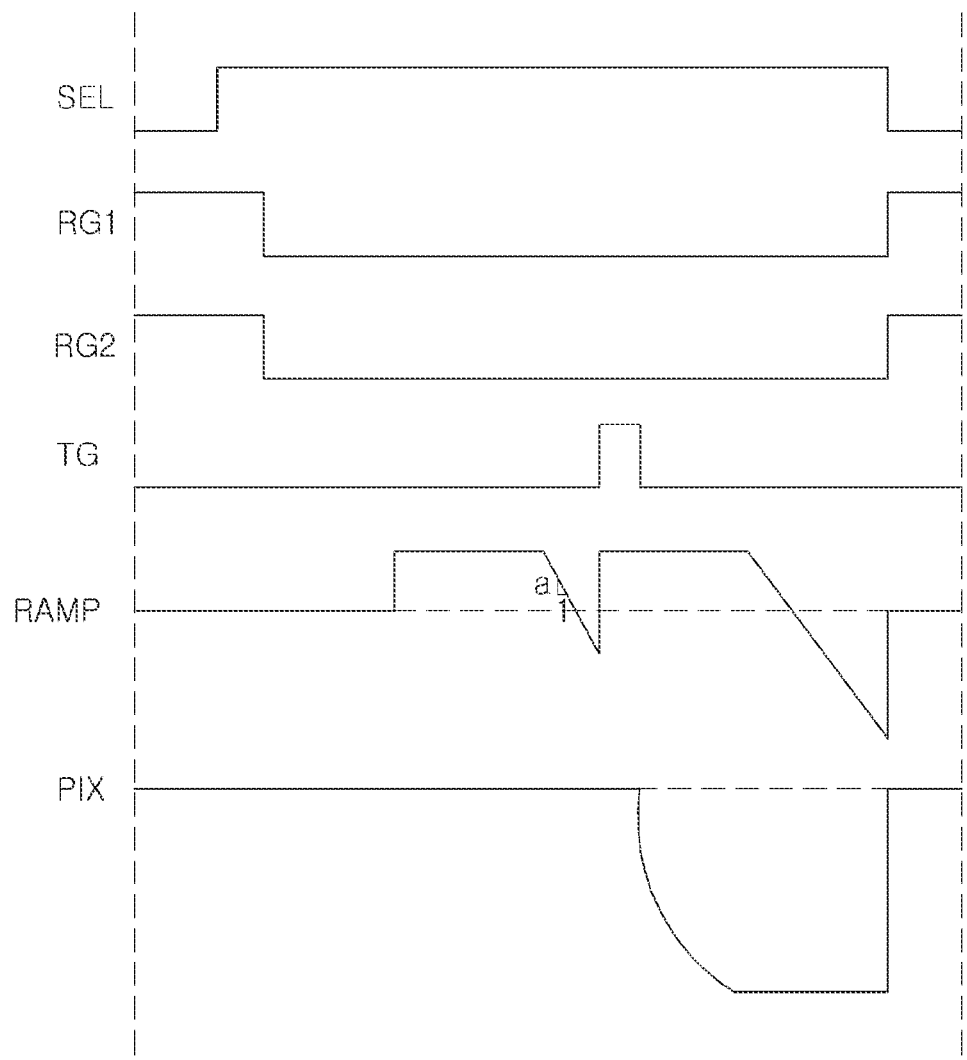
FIG. 12 is a signal diagram illustrating operation of an image sensor according to embodiments of the inventive concept.

FIG. 12 is a signal diagram illustrating operation of an image sensor according to embodiments of the inventive concept.

Referring to FIG. 12, before a read-out operation is performed by an image sensor, when a first reset transistor RX1 and a second reset transistor RX2 are turned ON by a first reset control signal RG1 and a second reset control signal RG2, a voltage of a floating diffusion FD may be reset. In a low gain mode, when the voltage of the floating diffusion FD is reset, the first reset transistor RX1 and the second reset transistor RX2 may be turned OFF, and a reset voltage may be read-out by an activated selection control signal SEL. When the read-out of the reset voltage ends, a transfer transistor TX may be turned ON by a transfer control signal TG, and electrical charge generated by a photodiode PD may transfer to the floating diffusion FD. Thereafter, the read-out of a pixel voltage may be performed based on electrical charge accumulated in a floating capacitor.

In image sensors according to embodiments of the inventive concept, gain in the low gain mode is assumed to be a first value (e.g., 1 to 2 times). While the transfer control signal TG controlling the transfer transistor TX included in the pixel circuit is activated in the low gain mode, the second reset control signal RG2 may be deactivated, and the second reset transistor RX2 may be turned OFF.

A read-out operation of a pixel signal may be performed based on a count value when a ramp voltage RAMP decreases. For example, in the low gain mode, the ramp voltage RAMP may decrease with a slope of 'a.' A pixel voltage PIX may be maintained as the reset voltage until the transfer control signal TG is activated. When the transfer control signal TG is activated and the transfer transistor TX is turned ON, electrical charge accumulated in the photodiode PD may transfer to the floating diffusion FD. Therefore, the pixel voltage PIX may decrease, as shown in FIG. 8.

FIGS. 13A, 13B, 13C, 14A, 14B and 14C (hereafter collectively, FIGS. 13A to 14C") are conceptual diagram illustrating operation of an image sensor according to embodiments of the inventive concept.

Figure 13A:
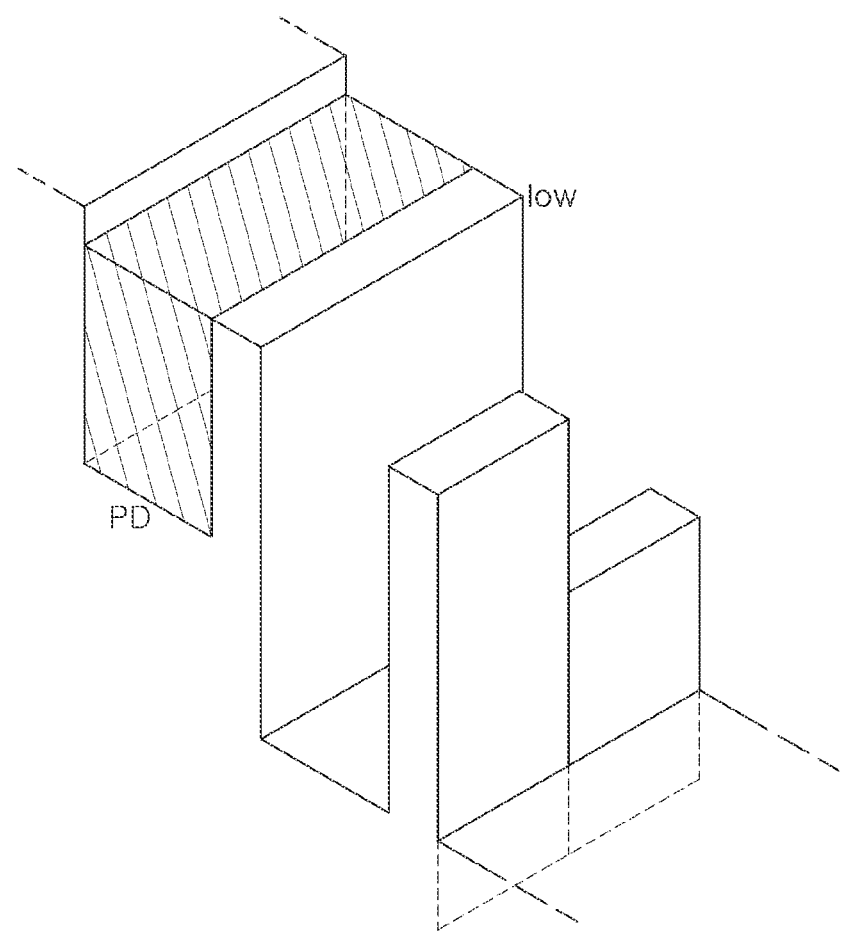
FIGS. 13A, 13B, 13C, 14A, 14B and 14C are conceptual diagrams illustrating operation of an image sensor according to embodiments of the inventive concept.
Figure 13B:
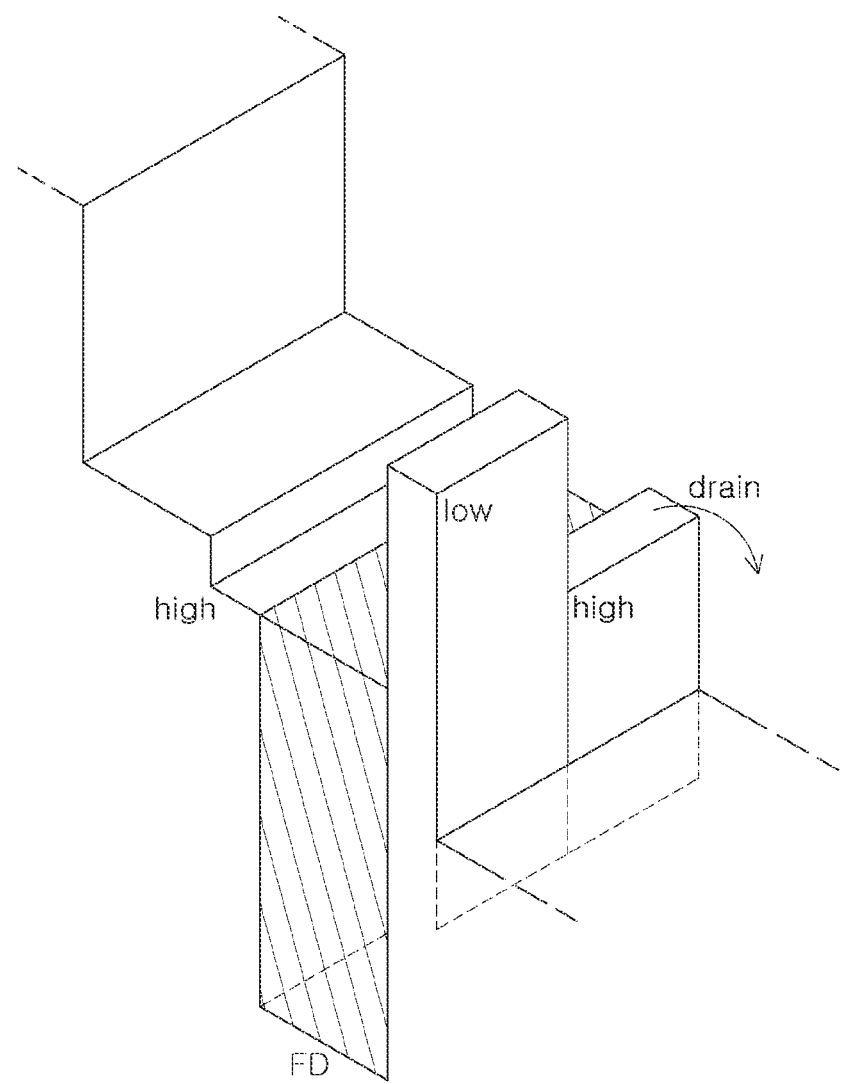
Figure 13C:
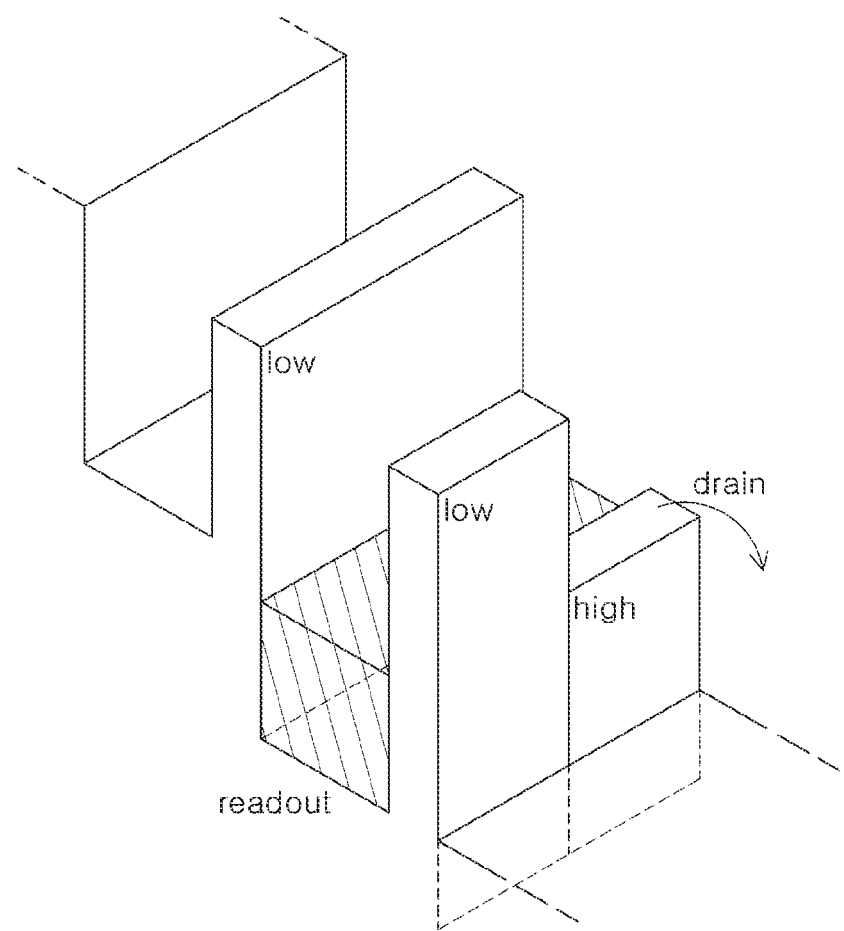
Figure 14A:
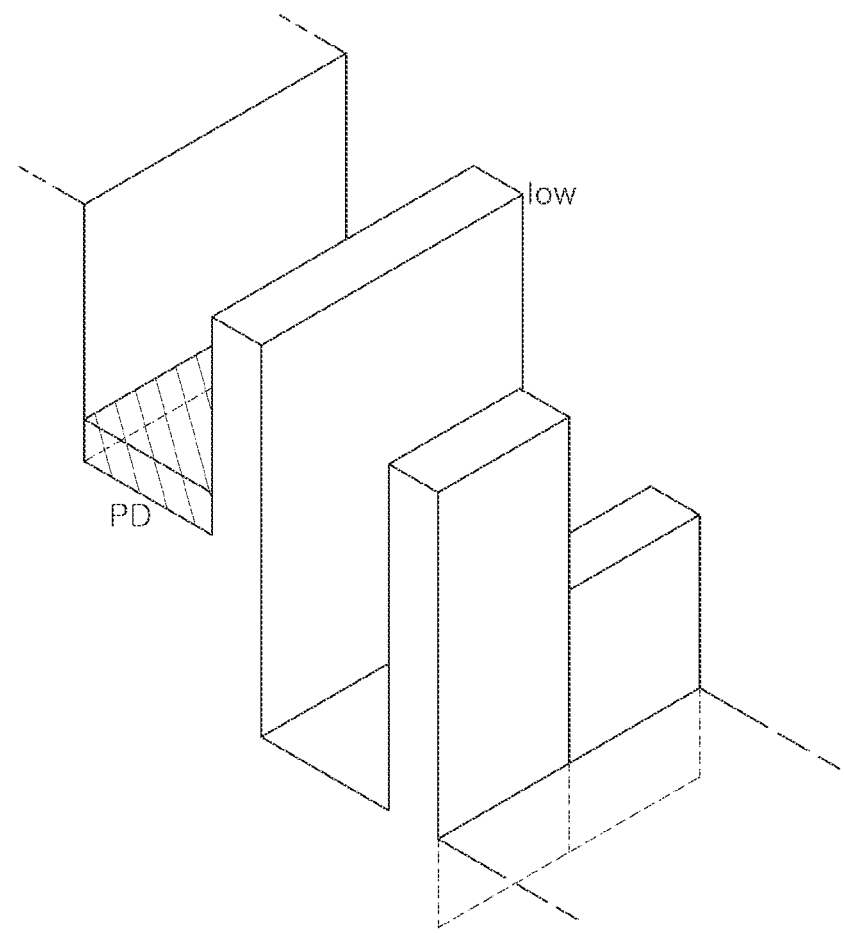
Figure 14B:
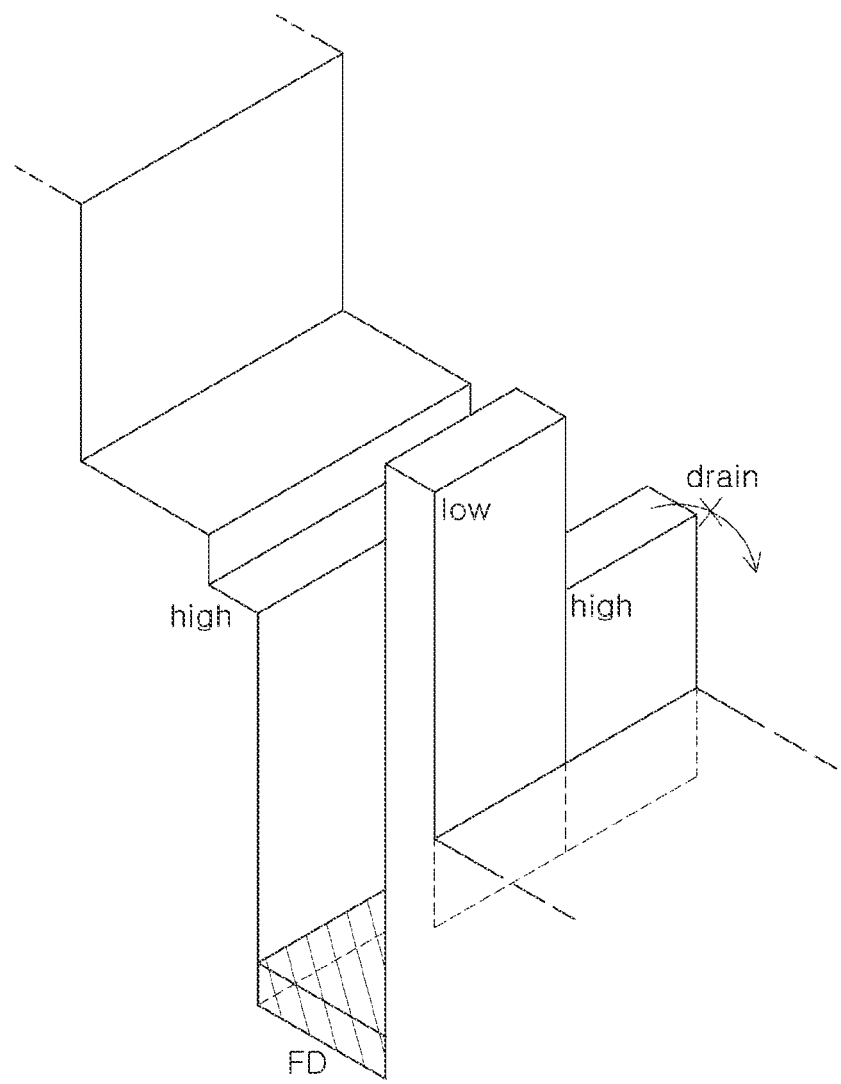
Figure 14C:
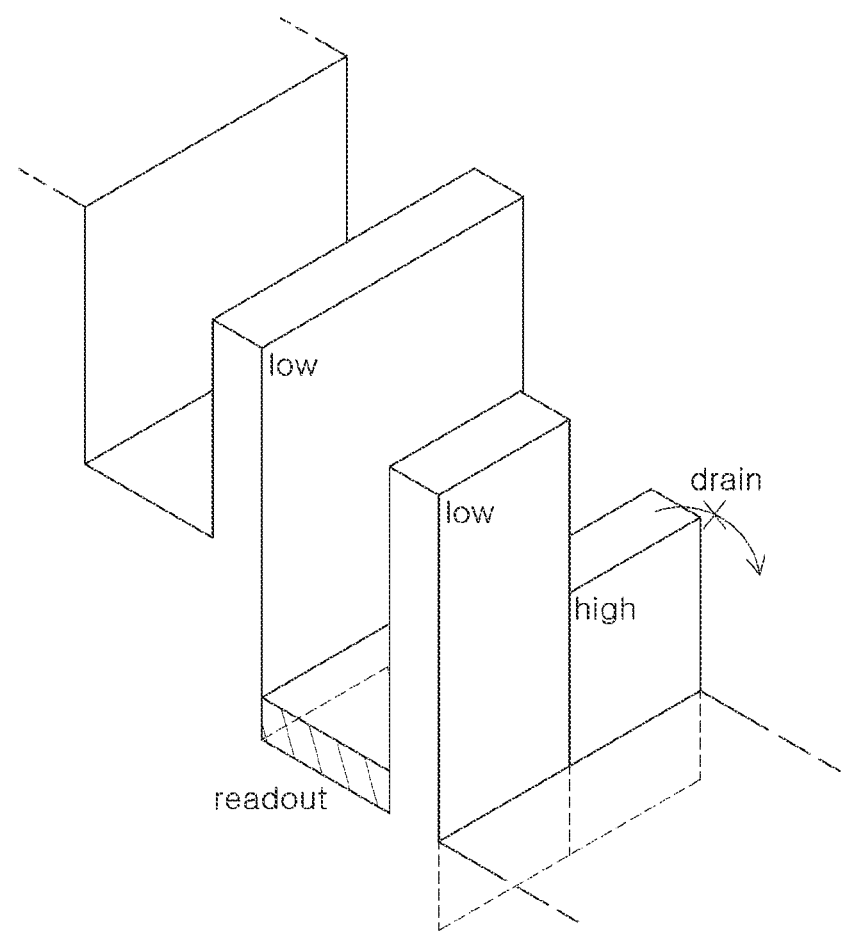

FIGS. 13A to 14C illustrate a read-out operation performed by an image sensor in a high gain mode in which gain for a pixel signal is large. That is, FIGS. 13A, 13B and 13C show a read-out operation when at least one photodiode PD included in a pixel receives incident light having a high luminance level while operating in a high gain mode. FIGS. 14A, 14B and 14C show a read-out operation when at least one photodiode PD included in another pixel receives incident light having a low luminance level while operating in a high gain mode. Here, the read-out process of FIGS. 13A to 14C are analogous to the read-out process described in relation to FIGS. 10A to 11C.

Referring to FIG. 13A, at least one photodiode PD generates electrical charge in a relatively bright environment. The electrical charge may be accumulated in the photodiode PD, when a transfer transistor TX is turned OFF and has a low potential barrier.

Referring to FIGS. 13B and 13C, when a transfer transistor TX has a high potential barrier as the transfer transistor TX is turned ON, electrical charge may transfer to and accumulate in a floating diffusion FD (e.g., a floating capacitor connected to the floating diffusion FD). When performing a read-out operation in a high gain mode, a first reset transistor RX1 may be turned OFF, and a second reset transistor RX2 may be turned ON. Therefore, the first reset transistor RX1 may have a low potential barrier with a relatively higher height, and the second reset transistor RX2 may have a high potential barrier with a relatively lower height.

Referring to FIGS. 14A, 14B and 14C, at least one photodiode PD included in another unit pixel may generate electrical charge in a relatively dark environment. For example, an amount of electrical charge generated by the at least one photodiode PD illustrated in FIGS. 14A, 14B and 14C may be less than an amount of electrical charge generated by the at least one photodiode PD illustrated in FIGS. 13A, 13B and 13C. Operation of the transistors may be generally similar to that described in relation to the FIGS. 13A, 13B and 13C. However, transfer of the accumulated electrical charge may be different.

The second reset transistor RX2 is turned ON in the high gain mode, and may thus have a relatively low potential barrier. Therefore, a portion of electrical charge accumulated in the floating diffusion FD may be drained to the power node, before the read-out operation.

For example, as illustrated in FIG. 13B, when electrical charge accumulated in the floating diffusion FD are sufficient to cross the potential barrier by the second reset transistor RX2, drain may occur. As illustrated in FIG. 14B, when electrical charge accumulated in the floating diffusion FD are not sufficient to cross the potential barrier by the second reset transistor RX2, drain may not occur.

An image sensor according to an embodiment of the inventive concept may perform a read-out operation, based on a charge in which a portion of electrical charge accumulated in the floating diffusion FD is drained, in a high gain mode. Therefore, even when there is a difference in illuminance of light exposed between photodiodes PD, a magnitude of parasitic capacitance formed by a difference in amount of accumulated electrical charge may decrease.

In a high gain mode, a need to output a pixel signal using all electrical charge may be relatively low. In addition, current generated in a process of draining a portion of electrical charge may be relatively small, as compared to current related to the operation of the image sensor. Therefore, even when a portion of electrical charge is drained, like an image sensor according to an embodiment of the inventive concept, there may be no critical problem in a pixel signal.

Figure 15:
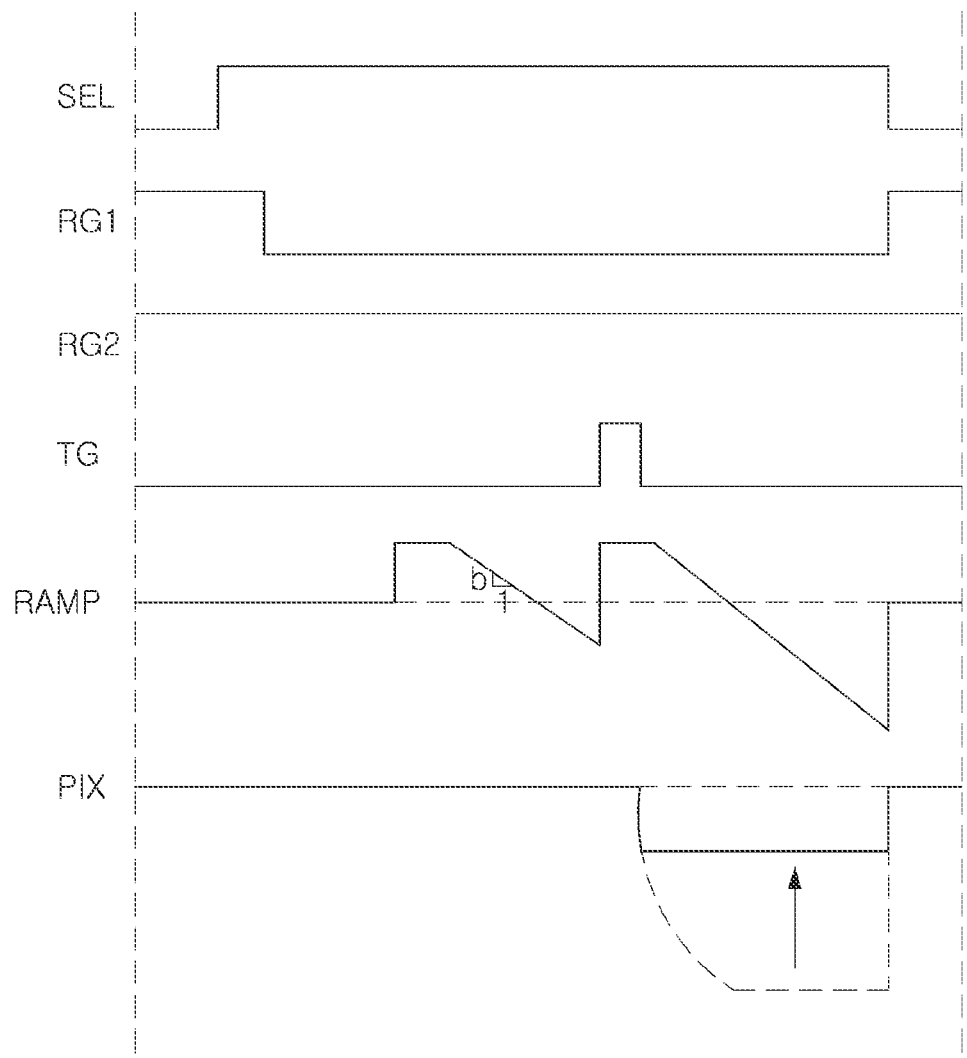
FIG. 15 is a signal diagram illustrating operation of an image sensor according to embodiments of the inventive concept.

FIG. 15 is a signal diagram illustrating operation of an image sensor according to embodiments of the inventive concept.

Referring to FIG. 15, before a read-out operation of an image sensor is performed, when a first reset transistor RX1 and a second reset transistor RX2 are turned ON by a first reset control signal RG1 and a second reset control signal RG2, a voltage of a floating diffusion FD may be reset. After the voltage of the floating diffusion FD is reset, a reset voltage may be read-out by an activated selection control signal SEL. In a high gain mode, when the voltage of the floating diffusion FD is reset, the second reset transistor RX2 may be maintained in an ON state, and only the first reset transistor RX1 may be turned OFF. When the read-out of the reset voltage is complete, a transfer transistor TX may be turned ON by a transfer control signal TG, and electrical charge generated by a photodiode PD may transfer to the floating diffusion FD. Thereafter, read-out of a pixel voltage may be performed based on electrical charge accumulated in a floating capacitor.

In some embodiments, gain in the high gain mode may be a second value. For example, the second value may be between 15 and 16 times. For example, while the transfer control signal TG for controlling the transfer transistor TX included in the pixel circuit is activated in the high gain mode, the second reset control signal RG2 may be activated, and the second reset transistor RX2 may be turned ON.

A read-out operation of a pixel signal may be performed based on a count value when a ramp voltage RAMP decreases. For example, in the high gain mode, the ramp voltage RAMP may decrease with a slope of 'b', less than the slope 'a' of the ramp voltage RAMP in the low gain mode shown in FIG. 12. Other read-out operations may correspond to those illustrated in FIG. 12. In the high gain mode, since the ramp voltage may decrease with a relatively lesser slope, the count value may be relatively greater. This outcome (e.g., the relatively lesser slope and greater count value) largely obviates the potential problems associated with the output pixel signal—even when a portion of accumulated electrical charge has been drained—according to image sensors consistent with embodiments of the inventive concept.

Figure 16:
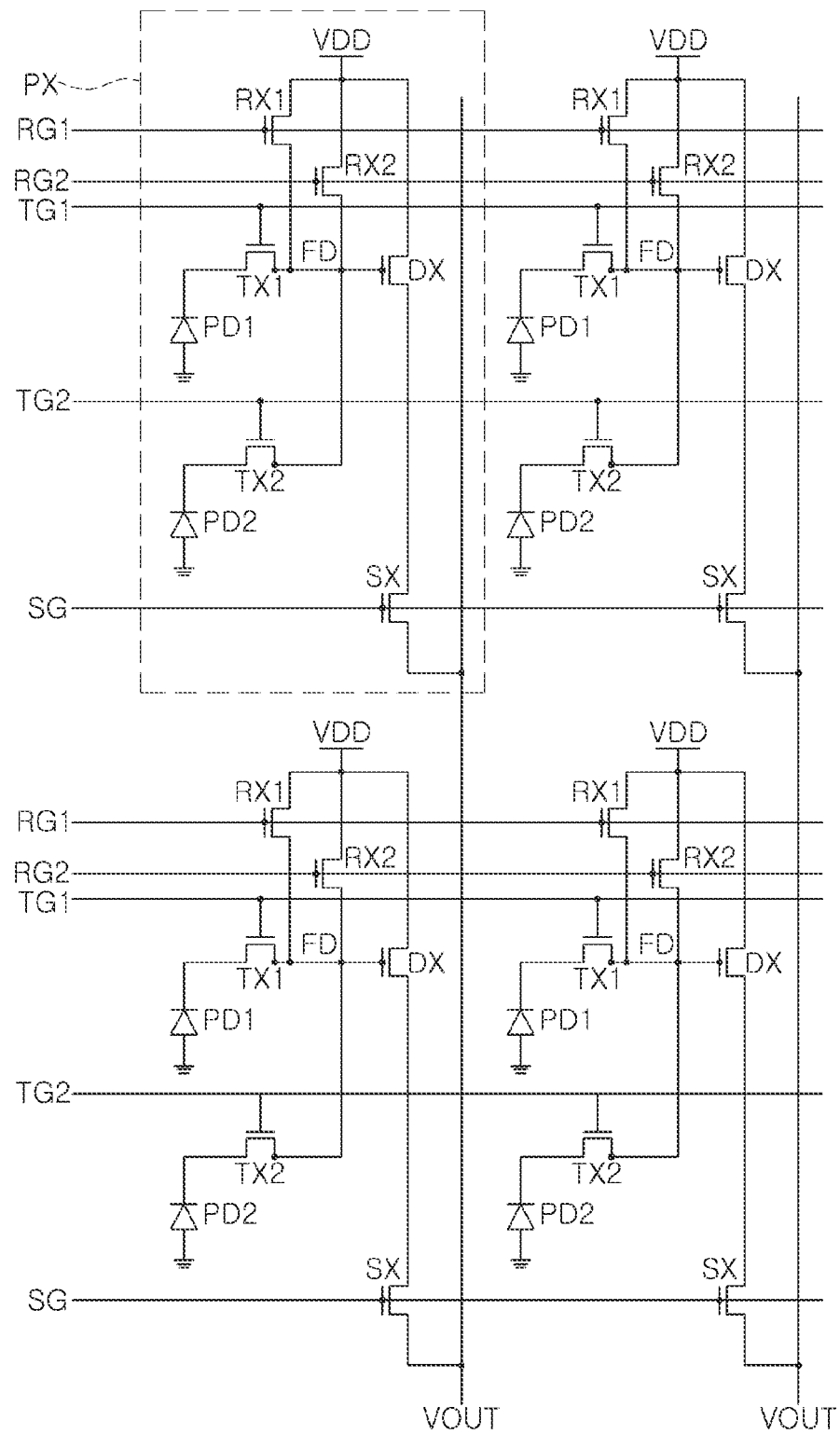
FIGS. 16 and 17 are respective circuit diagrams illustrating pixels that may be included in an image sensor according to embodiments of the inventive concept.
Figure 17:
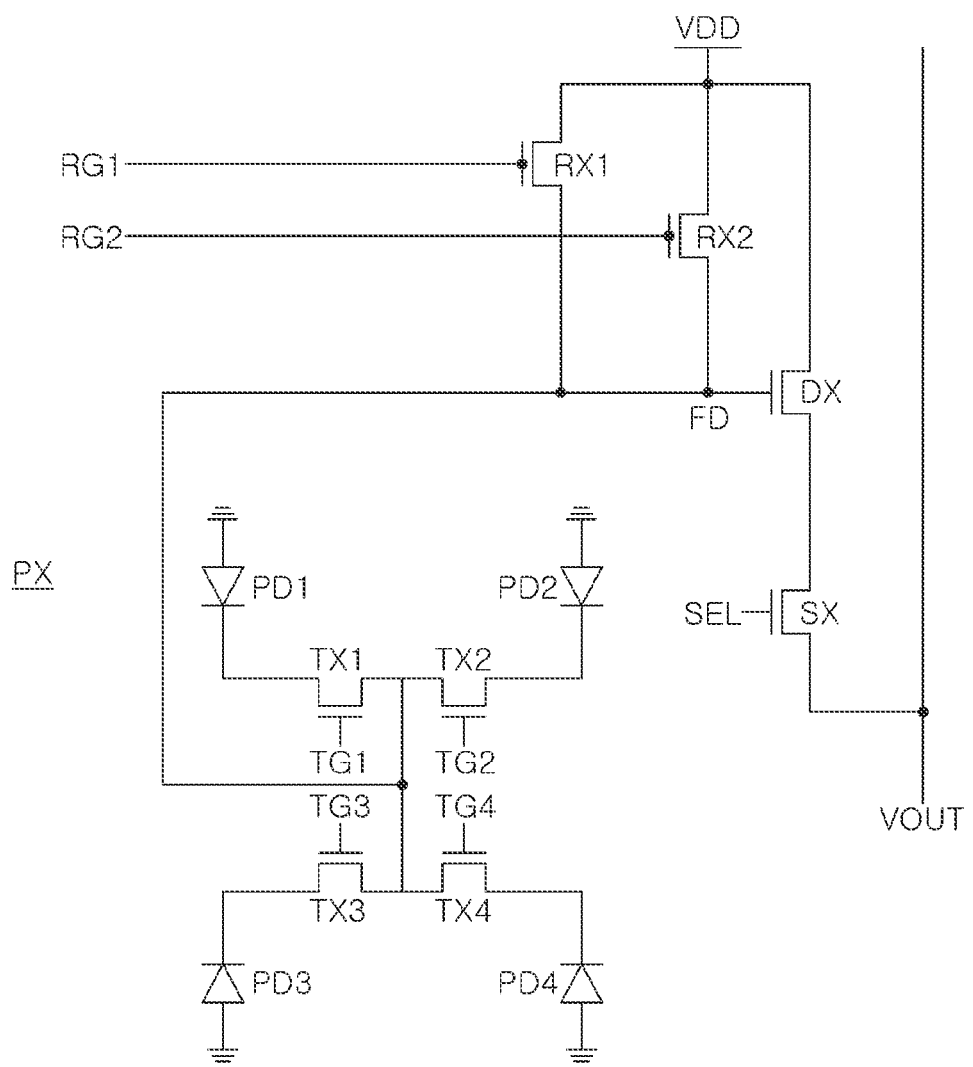

FIGS. 16 and 17 are circuit diagrams respectively illustrating portions of pixel arrays (e.g., pixel(s)) that maybe included in an image sensor according to embodiments of the inventive concept.

Referring to FIG. 16, pixels PX may include parallel-connected photodiodes PD1 and PD2, corresponding reset transistors RX1 and RX2, and corresponding transmission transistors TX1 and TX2. Here, the pixels PX are shown arranged in a pixel group.

Referring to FIG. 17, pixels PX may include two reset transistors RX1 and RX2, four photodiodes PD1, PD2, PD3, PD4, and four corresponding transmission transistors TX1, TX2, TX3, TX4. Here again, the pixels PX are shown arranged in a pixel group.

Consistent with the image sensor portions illustrated in FIGS. 16 and 17, multiple photodiodes may share a floating diffusion (FD), a drive transistor (DX), a select transistor (SX), and two reset transistors (RX1, RX2). For example, when any one of the transfer transistors corresponding to the photodiodes may be turned ON, the other may be turned OFF. In this manner, the image sensor may sequentially acquire pixel signals corresponding to each of the photodiodes by sequentially turning ON the transmission transistors.

Figure 18:
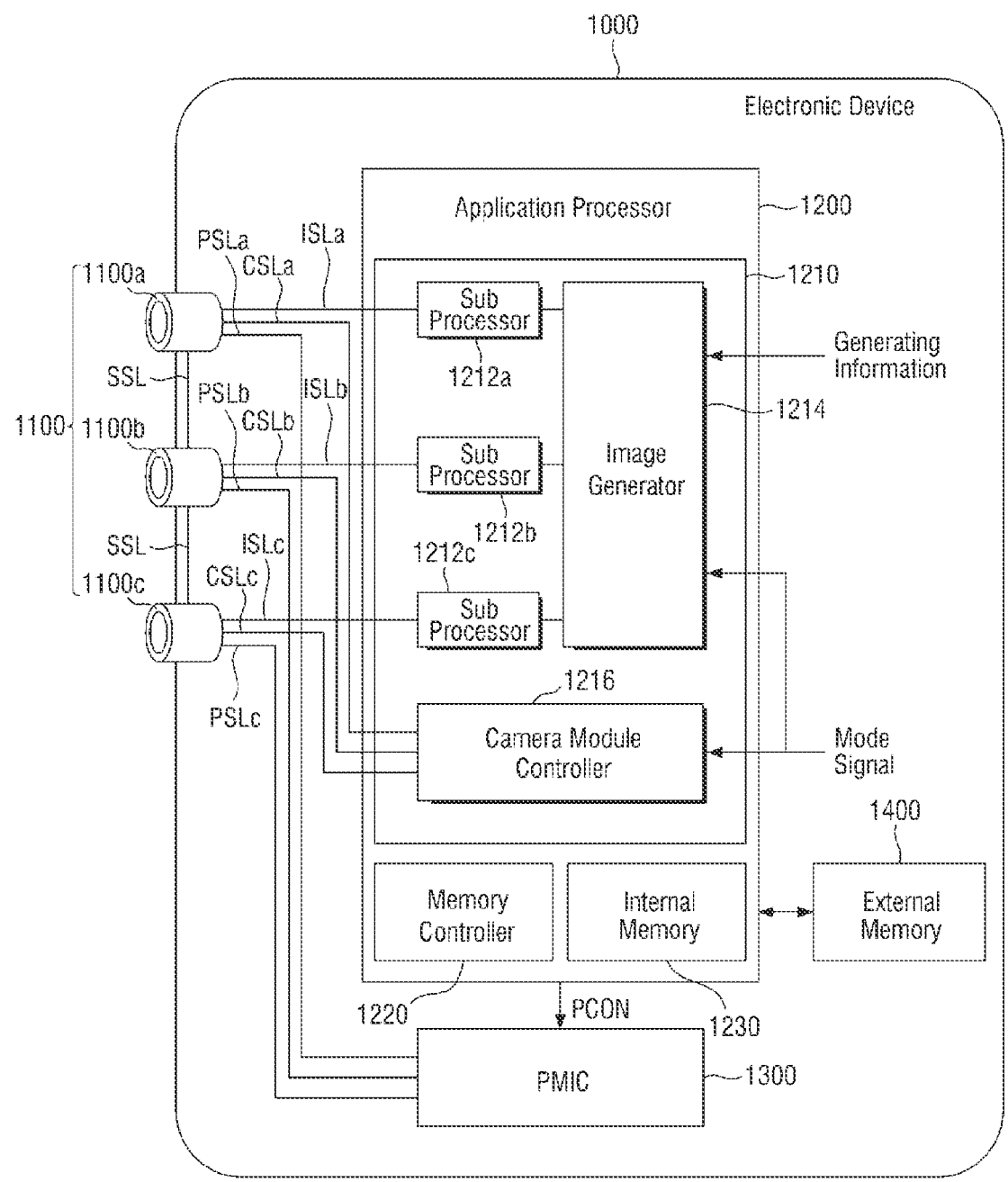
FIGS. 18 and 19 are respective block diagrams illustrating electronic devices that may include an image sensor according to embodiments of the inventive concept.
Figure 19:
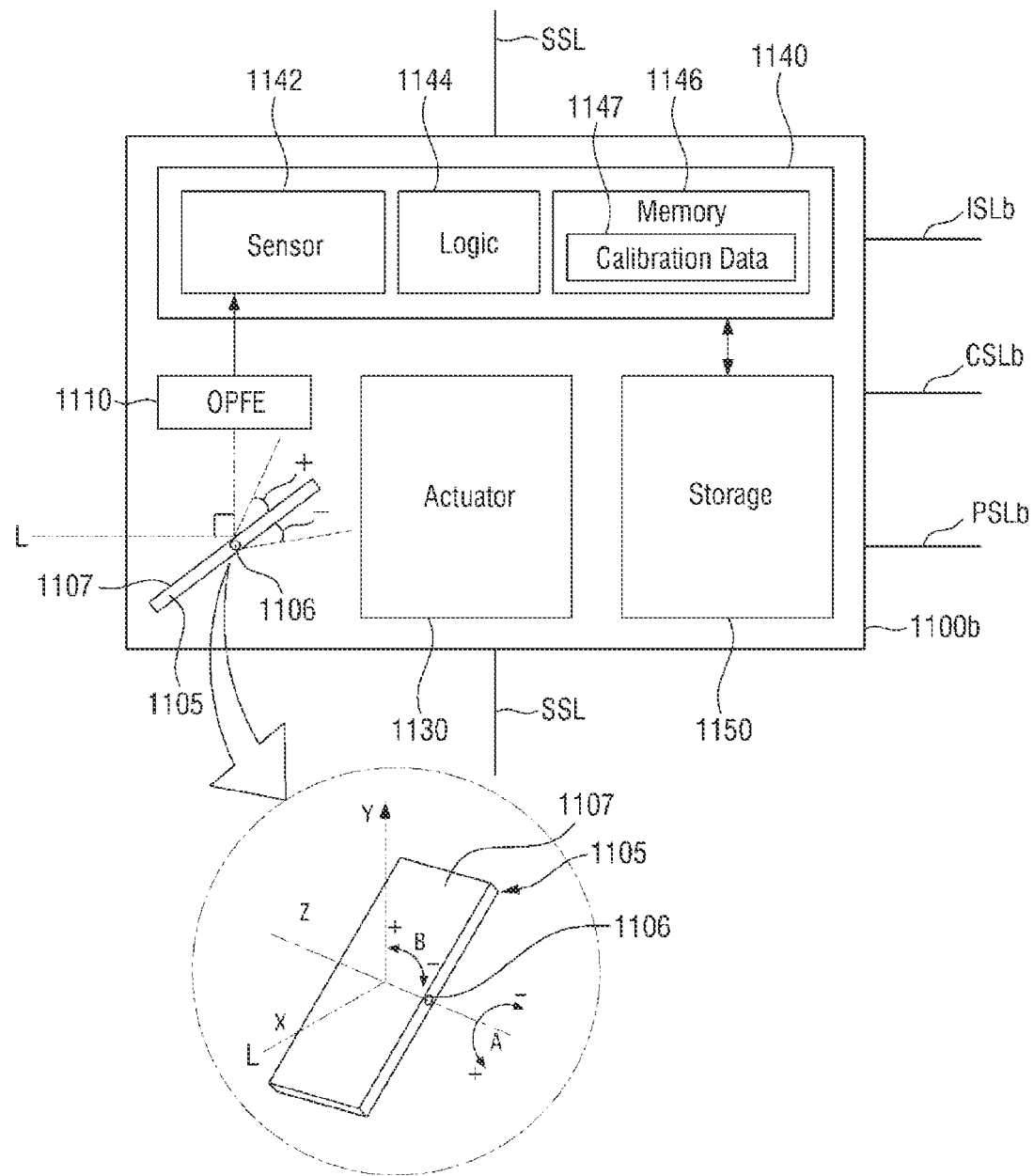

FIGS. 18 and 19 are block diagrams illustrating various electronic devices that may include an image sensor according to embodiments of the inventive concept.

Referring to FIG. 18, an electronic device 1000 may include a camera module group 1100, an application processor 1200, a PMIC 1300, and/or an external memory 1400.

The camera module group 1100 may include a plurality of camera modules 1100a, 1100b, and 1100c. Although the drawing illustrates embodiments in which three camera modules 1100a, 1100b, and 1100c are arranged, embodiments are not limited thereto. In some embodiments, the camera module group 1100 may be modified to include only two (2) camera modules. In addition, in some embodiments, the camera module group 1100 may be modified and implemented to include n (where n is a natural number of 4 or more) camera modules. In addition, in some embodiments, at least one of the plurality of camera modules 1100a, 1100b, and 1100c included in the camera module group 1100 may be implemented by the image sensors according to any one of the foregoing embodiments.

Referring to FIG. 19, one particular configuration of the camera module 1100b will be described in some additional detail, but the following description may be equally applied to other camera modules 1100a and 1100c according to embodiments.

Referring back to FIG. 19, the camera module 1100b may include a prism 1105, an optical path folding element (hereinafter referred to as "OPFE") 1110, an actuator 1130, an image sensing device 1140, and a storage device 1150.

The prism 1105 may include a reflective surface 1107 of a light reflecting material to change a path of light L externally incident.

In some embodiments, the prism 1105 may change the path of the light L, incident in a first direction X, to a second direction Y, perpendicular to the first direction X. In addition, the prism 1105 may rotate the reflective surface 1107 of the light reflecting material in a direction A around a central axis 1106, or may rotate the central axis 1106 in a direction B, to change the path of the light L, incident in the first direction X, to the second direction Y, perpendicular thereto. In some embodiments, the OPFE 1110 may also move in a third direction Z, perpendicular to the first direction X and the second direction Y.

In some embodiments, as illustrated, a maximum rotation angle of the prism 1105 in the direction A may be 15 degrees or less in a positive (+) direction thereof, and may be greater than 15 degrees in a negative (−) direction thereof. Embodiments are not limited thereto.

In some embodiments, the prism 1105 may move in a positive (+) direction or a negative (−) direction of the direction B by around 20 degrees, or between 10 degrees and 20 degrees, or between 15 degrees and 20 degrees. In some embodiments, a moving angle may be an angle that may move at the same angle in the positive (+) or negative (−) direction of the direction B, or may move to almost the same angle in a range of around 1 degree.

In some embodiments, the prism 1105 may move the reflective surface 1107 of the light reflecting material in a third direction (e.g., the direction Z), parallel to an extending direction of the central axis 1106.

The OPFE 1110 may include, for example, optical lenses of m (where m is a natural number) groups. The m optical lenses may move in the second direction Y to change an optical zoom ratio of the camera module 1100b. For example, if a basic optical zoom magnification of the camera module 1100b is Z, when the m optical lenses included in the OPFE 1110 move, an optical zoom magnification of the camera module 1100b may be changed to have an optical zoom magnification of 3Z, 5Z, or 5Z or higher.

The actuator 1130 may move the OPFE 1110 or an optical lens (hereinafter, referred to as an optical lens) to a specific position. For example, the actuator 1130 may adjust a position of the optical lens to locate an image sensor 1142 at a focal length of the optical lens for accurate sensation.

The image sensing device 1140 may include an image sensor 1142, a control logic 1144, and a memory 1146. The image sensor 1142 may sense an image of an object to be sensed using light L provided through an optical lens. The control logic 1144 may control an overall operation of the camera module 1100b. For example, the control logic 1144 may control an operation of the camera module 1100b according to a control signal provided through a control signal line CSLb.

The memory 1146 may store information necessary for an operation of the camera module 1100b, such as calibration data 1147. The calibration data 1147 may include information necessary for the camera module 1100b to generate image data using light L externally provided. The calibration data 1147 may include, for example, information on the degree of rotation, described above, information on a focal length, information on an optical axis, etc. When the camera module 1100b is implemented in the form of a multi-state camera of which focal length is changed according to a position of the optical lens, the calibration data 1147 may include a focal length value for each position (or state) of the optical lens, and information related to auto focusing.

The storage device 1150 may store the image data sensed by the image sensor 1142. The storage device 1150 may be disposed external to the image sensing device 1140, and may be implemented in stacked form with a sensor chip constituting the image sensing device 1140. In some embodiments, the storage device 1150 may be implemented as an electrically erasable programmable read-only memory (EEPROM), but embodiments are not limited thereto.

Referring collectively to FIGS. 18 and 19, in some embodiments, the plurality of camera modules 1100a, 1100b, and 1100c may include the actuator 1130, respectively. Therefore, the plurality of camera modules 1100a, 1100b, and 1100c may include the same or different calibration data 1147, respectively, according to an operation of the actuator 1130 included therein.

In some embodiments, a camera module (e.g., 1100b), among the plurality of camera modules 1100a, 1100b, and 1100c, may be a folded lens type camera module including the prism 1105 and the OPFE 1110, described above, and remaining camera module(s) (e.g., 1100a or 1100c) may be a vertical type camera module not including the prism 1105 and the OPFE 1110, but embodiments are not limited thereto.

In some embodiments, a camera module (e.g., 1100c), among the plurality of camera modules 1100a, 1100b, and 1100c, may be a vertical type depth camera for extracting depth information using, for example, infrared ray (IR). In some embodiments, the application processor 1200 may merge image data provided from the depth camera with image data provided from another camera module (for example, 1100a or 1100b) to generate a 3D depth image.

In some embodiments, at least two camera modules (e.g., 1100a and 1100b), among the plurality of camera modules 1100a, 1100b, and 1100c, may have different fields of view (e.g., field of view angles). In some embodiments, for example, optical lenses of the at least two camera modules (e.g., 1100a and 1100b), among the plurality of camera modules 1100a, 1100b, and 1100c, may be different from each other, but are not limited thereto.

In addition, in some embodiments, field of view angles of each of the plurality of camera modules 1100a, 1100b, and 1100c may be different. In some embodiments, optical lenses included in each of the plurality of camera modules 1100a, 1100b, and 1100c may also be different from each other, but are not limited thereto.

In some embodiments, each of the plurality of camera modules 1100a, 1100b, and 1100c may be arranged to be physically separated from each other. For example, a sensation area of the one image sensor 1142 may not be divided and used by the plurality of camera modules 1100a, 1100b, and 1100c, but an independent image sensor 1142 inside each of the plurality of camera modules 1100a, 1100b, and 1100c may be disposed.

Referring to FIG. 18, the application processor 1200 may include an image processing device 1210, a memory controller 1220, and an internal memory 1230. The application processor 1200 may be implemented to be separated from the plurality of camera modules 1100a, 1100b, and 1100c. For example, the application processor 1200 and the plurality of camera modules 1100a, 1100b, and 1100c may be implemented to be separated from each other, as separate semiconductor chips.

The image processing device 1210 may include a plurality of sub-image signal processors 1212a, 1212b, and 1212c, an image generator 1214, and a camera module controller 1216.

The image processing device 1210 may include a plurality of sub-image signal processors 1212a, 1212b and 1212c, corresponding to the number of camera modules 1100a, 1100b, and 1100c.

Image data generated from each of the camera modules 1100a, 1100b, and 1100c may be provided to the corresponding sub-image signal processors 1212a, 1212b, and 1212c through image signal lines ISLa, ISLb, and ISLc, separated from each other. For example, image data generated from the camera module 1100a may be provided to the sub-image signal processor 1212a through the image signal line ISLa, image data generated from the camera module 1100b may be provided to the sub-image signal processor 1212b through the image signal line ISLb, and image data generated from the camera module 1100c may be provided to the sub-image signal processor 1212c through the image signal line ISLc. Transmission of such image data may be performed using, for example, a camera serial interface (CSI) based on a mobile industry processor interface (MIPI), but embodiments are not limited thereto.

In some embodiments, a sub-image signal processor may be disposed to correspond to a plurality of camera modules. For example, the sub-image signal processor 1212a and the sub-image signal processor 1212c may not be implemented to be separated from each other, as illustrated, but may be implemented to be integrated into a single sub-image signal processor, and image data provided from the camera module 1100a and the camera module 1100c may be selected by a select element (e.g., a multiplexer) and may be then provided to the integrated sub-image signal processor.

Image data provided to each of the sub-image signal processors 1212a, 1212b, and 1212c may be provided to the image generator 1214. The image generator 1214 may use the image data provided from each of the sub-image signal processors 1212a, 1212b, and 1212c, according to image generation information or a mode signal, to generate an output image.

In particular, the image generator 1214 may merge at least portion of the image data generated from the camera modules 1100a, 1100b, and 1100c having different field of view angles, according to image generation information or a mode signal, to generate an output image. In addition, the image generator 1214 may generate an output image by selecting one of image data generated from camera modules 1100a, 1100b, and 1100c having different viewing angles according to image generation information or a mode signal.

In some embodiments, the image generation information may include a zoom signal or a zoom factor. Further, in some embodiments, the mode signal may be, for example, a signal based on a mode selected by a user.

When the image generation information is a zoom signal (e.g., a zoom factor) and each of the camera modules 1100a, 1100b, and 1100c has a different field of view field (e.g., a different field of view angle), the image generator 1214 may operate differently according to a type of the zoom signal. For example, when the zoom signal is a first signal, after merging image data output from the camera module 1100a and image data output from the camera module 1100c, the merged image signal and image data output from the camera module 1100b, not used in the merging, may be used to generate an output image. When the zoom signal is a second signal, different from the first signal, the image generator 1214 may not perform such image data merging, and may select one of the image data output from each of the camera module 1100a, 1100b, and 1100c, to create an output image. Example embodiments are not limited thereto, and a method of processing image data may be modified and performed as needed.

In some embodiments, the image generator 1214 may receive a plurality of pieces of image data having different exposure points in time from at least one sub-image signal processor, among the plurality of sub-image signal processors 1212a, 1212b, and 1212c, and may process high dynamic range (HDR) with respect to the plurality of pieces of image data, to generate merged image data having an increased dynamic range.

The camera module controller 1216 may provide a control signal to each of the camera modules 1100a, 1100b, and 1100c. The control signal generated from the camera module controller 1216 may be provided to the corresponding camera modules 1100a, 1100b, and 1100c through control signal lines CSLa, CSLb, and CSLc, separated from each other.

One of the plurality of camera modules 1100a, 1100b, and 1100c may be designated as a master camera (for example, 1100b), according to image generation information including a zoom signal, or a mode signal, and remaining camera modules (for example, 1100a and 1100c) may be designated as slave cameras. Such information may be included in the control signal, and may be provided to the corresponding camera modules 1100a, 1100b, and 1100c through the control signal lines CSLa, CSLb, and CSLc, separated from each other.

Camera modules operating as masters and slaves may be changed according to a zoom factor or an operation mode signal. For example, when a field of view angle of the camera module 1100a is wider than a field of view angle of the camera module 1100b and the zoom factor indicates a low zoom magnification, the camera module 1100b may operate as a master, and the camera module 1100a may operate as a slave. When the zoom factor indicates a high zoom magnification, the camera module 1100a may operate as a master and the camera module 1100b may operate as a slave.

In some embodiments, a control signal provided from the camera module controller 1216 to each of the camera modules 1100a, 1100b, and 1100c may include a sync enable signal. For example, when the camera module 1100b is a master camera and the camera modules 1100a and 1100c are slave cameras, the camera module controller 1216 may transmit a sync enable signal to the camera module 1100b. The camera module 1100b receiving such a sync enable signal may generate a sync signal based on the sync enable signal, and may transmit the generated sync signal to the camera modules 1100a and 1100c through a sync signal line SSL. The camera module 1100b and the camera modules 1100a and 1100c may be synchronized with the sync signal, to transmit image data to the application processor 1200.

In some embodiments, a control signal provided from the camera module controller 1216 to the plurality of camera modules 1100a, 1100b, and 1100c may include mode information according to a mode signal. Based on this mode information, the plurality of camera modules 1100a, 1100b, and 1100c may operate in a first operation mode and a second operation mode in relation to a sensation rate.

In the first operation mode, the plurality of camera modules 1100a, 1100b, and 1100c may generate an image signal at a first rate (for example, generate an image signal of a first frame rate), may encode the generated image signal at a second rate, higher than the first rate (e.g., encode an image signal having a second frame rate, higher than the first frame rate), and may transmit the encoded image signal to the application processor 1200. In some embodiments, the second rate may be 30 times or less of the first rate.

The application processor 1200 may store the transmitted image signal, e.g., the encoded image signal, in the internal memory 1230, or in an external memory 1400 external to the application processor 1200, and may then read the encoded image signal from the internal memory 1230 or the external memory 1400, may decode the read image signal, and may display image data generated based on the decoded image signal. For example, a corresponding sub-image signal processor, among the plurality of sub-image signal processors 1212a, 1212b, and 1212c of the image processing device 1210, may decode the read image signal, and may also perform image processing on the decoded image signal.

In the second operation mode, the plurality of camera modules 1100a, 1100b, and 1100c may generate an image signal at a third rate, lower than the first rate (e.g., generate an image signal of a third frame rate, lower than the first frame rate), and may transmit the image signal to the application processor 1200. The image signal provided to the application processor 1200 may be a signal, not encoded. The application processor 1200 may perform image processing on the received image signal, or may store the received image signal in the internal memory 1230 or the external memory 1400.

The PMIC 1300 may supply power, for example, a power supply voltage to each of the plurality of camera modules 1100a, 1100b, and 1100c. For example, the PMIC 1300 may supply first power to the camera module 1100a through a power signal line PSLa under control of the application processor 1200, may supply second power to the camera module 1100b through a power signal line PSLb, and may supply third power to the camera module 1100c through a power signal line PSLc.

The PMIC 1300 may generate power, corresponding to each of the plurality of camera modules 1100a, 1100b, and 1100c, in response to a power control signal PCON from the application processor 1200, and may also adjust a level of the power. The power control signal PCON may include a power adjustment signal for each operation mode of the plurality of camera modules 1100a, 1100b, and 1100c. For example, the operation mode may include a low power mode. In some embodiments, the power control signal PCON may include information on a camera module operating in the low power mode and a level of the power to be set. The levels of power provided to each of the plurality of camera modules 1100a, 1100b, and 1100c may be the same or different from each other. Also, the level of power may be dynamically changed.

An image sensor according to an embodiment of the inventive concept may adjust ON/OFF timing of parallel-connected reset transistors based on gain of an ADC. A portion of electrical charge accumulated in a floating diffusion may be drained to a power node during an operation having high gain. Therefore, the possibility of generating noise, such as SHBN, caused by a difference in electrical charge between pixels may be reduced.

Various advantages and effects of the inventive concept are not limited to the above-described contents, and may be more easily understood in the process of describing specific embodiments of the inventive concept.

While embodiments have been illustrated and described above, it will be apparent to those skilled in the art that modifications and variations could be made without departing from the scope of the inventive concept as defined by the appended claims.

What is claimed is:

1. An image sensor comprising:
 a pixel array including pixels, wherein each pixel includes at least one photodiode generating electrical charge and a pixel circuit providing a pixel signal based on the electrical charge; and
 a logic circuit configured to generate an image based on the pixel signal,
 wherein the pixel circuit includes a parallel-connected first reset transistor and second reset transistor, and
 the logic circuit determines whether the second reset transistor is turned ON/OFF based on a level of incident light received by the at least one photodiode during an exposure time period,
 wherein a second turn-ON voltage corresponding to a height of a potential barrier corresponding to a condition in which the second reset transistor is turned ON is lower than a first turn-ON voltage corresponding to a height of a potential barrier corresponding to a condition in which the first reset transistor is turned ON.

2. The image sensor of claim 1, wherein a second turn-OFF voltage corresponding to a height of a potential barrier corresponding to a condition in which the second reset transistor is turned OFF is less than or equal to a first turn-OFF voltage corresponding to a height of a potential barrier corresponding to a condition in which the first reset transistor is turned OFF.

3. The image sensor of claim 1, wherein the first turn-ON voltage is about 2 to 4V.

4. The image sensor of claim 1, wherein a first gate electrode of the first reset transistor receives a first reset control signal, and a second gate electrode of the second reset transistor receive a second reset control signal, different from the first reset control signal.

5. The image sensor of claim 4, wherein, when the first reset transistor and the second reset transistor are turned OFF during a read-out operation, a value of the second reset control signal is less than a value of the first reset control signal.

6. The image sensor of claim 4, wherein, when the first reset transistor is turned OFF and the second reset transistor is turned ON during a read-out operation, a value of the second reset control signal is greater than a value of the first reset control signal.

7. The image sensor of claim 1, wherein the logic circuit is further configured to adjust gain of the pixel signal based on a luminance level of incident light during the exposure time period.

8. The image sensor of claim 7, wherein, when the gain of the pixel signal is set to a first value, the second reset transistor is turned OFF and at least one transfer transistor included in the pixel circuit is turned ON.

9. The image sensor of claim 8, wherein the first value is set between about one times and two times.

10. The image sensor of claim 8, wherein, when the gain of the pixel signal is set to a second value different from the first value, the second reset transistor is turned ON and at least one transfer transistor included in the pixel circuit is turned ON.

11. The image sensor of claim 10, wherein the second value is set between about fifteen times and sixteen times.

12. An image sensor comprising:
 at least one photodiode that generates electrical charge based on a luminance level of incident light during an exposure time period;
 a floating diffusion that accumulates the electrical charge;
 at least one transfer transistor connected between the at least one photodiode and the floating diffusion;
 parallel-connected first reset transistor and second reset transistor connected between a power node providing a power supply voltage and the floating diffusion; and
 a drive transistor operating as a source-follower amplifier,
 wherein the first reset transistor and the second reset transistor have different threshold voltages, and
 wherein a first gate electrode of the first reset transistor is connected to a second gate electrode of the second reset transistor.

13. The image sensor of claim 12, wherein electrodes of the first reset transistor are directly and respectively connected to electrodes of the second reset transistor.

14. The image sensor of claim 12, wherein a second threshold voltage of the second reset transistor is greater than a first threshold voltage of the first reset transistor.

15. The image sensor of claim 12, wherein a first gate electrode of the first reset transistor receives a first reset control signal, and a second gate electrode of the second reset transistor receives a second reset control signal, different from the first reset control signal.

16. An image sensor comprising:
 at least one photodiode that generates electrical charge based on a luminance level of incident light during an exposure time period; and
 a pixel circuit including a floating diffusion that accumulates the electrical charge, at least one transfer transistor connected between the at least one photodiode and the floating diffusion, and parallel-connected first reset transistor and second reset transistor connected between a power node providing a power supply voltage and the floating diffusion,
 wherein a turn-ON voltage applied to the second reset transistor is less than a turn-ON voltage applied to the first reset transistor, and
 the second reset transistor is turned ON when the at least one transfer transistor is turned ON.

17. The image sensor of claim 16, wherein the first reset transistor and the second reset transistor are turned ON/OFF at different times during a read-out operation of the pixel circuit.

18. The image sensor of claim 16, wherein the first reset transistor is turned OFF when the at least one transfer transistor is turned ON.

19. The image sensor of claim 16, wherein a turn-OFF voltage of the second reset transistor is less than a turn-OFF voltage of the first reset transistor.

* * * * *